(12) United States Patent
Sato et al.

(10) Patent No.: US 12,046,607 B2
(45) Date of Patent: Jul. 23, 2024

(54) IMAGING DEVICE

(71) Applicant: Panasonic Intellectual Property Management Co., Ltd., Osaka (JP)

(72) Inventors: Yoshihiro Sato, Osaka (JP); Yoshinori Takami, Toyama (JP); Ryota Sakaida, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/330,197

(22) Filed: Jun. 6, 2023

(65) Prior Publication Data

US 2023/0317746 A1     Oct. 5, 2023

Related U.S. Application Data

(63) Continuation of application No. 17/191,437, filed on Mar. 3, 2021, now Pat. No. 11,715,748, which is a
(Continued)

(30) Foreign Application Priority Data

Oct. 15, 2018    (JP) ................................ 2018-194571

(51) Int. Cl.
    *H01L 27/146*         (2006.01)
(52) U.S. Cl.
    CPC .. *H01L 27/14614* (2013.01); *H01L 27/14607* (2013.01); *H01L 27/1463* (2013.01); *H01L 27/14643* (2013.01)

(58) Field of Classification Search
    CPC ......... H01L 27/14614; H01L 27/14607; H01L 27/1463; H01L 27/14643; H01L 27/14636;
(Continued)

(56) References Cited

U.S. PATENT DOCUMENTS 10,304,828 B2    5/2019   Sato et al.
10,833,128 B2    11/2020   Miyanami et al.
(Continued)

FOREIGN PATENT DOCUMENTS

JP      2010-034563 A     2/2010
JP      2012-212940 A     11/2012
(Continued)

OTHER PUBLICATIONS

Non-Final Office Action issued in U.S. Appl. No. 16/586,805, dated Sep. 4, 2020.
(Continued)

*Primary Examiner* — Mohammad A Rahman
(74) *Attorney, Agent, or Firm* — Rimon P.C.

(57) ABSTRACT

An imaging device including: a photoelectric converter that converts light into a charge; a first diffusion region of a first conductivity type to which the charge is input; a second diffusion region of the first conductivity type; a first plug that has a first surface directly connected to the first diffusion region; and a second plug that has a second surface directly connected to the second diffusion region, where an area of the second surface of the second plug is larger than an area of the first surface of the first plug in a plan view.

17 Claims, 10 Drawing Sheets

Related U.S. Application Data continuation of application No. 16/586,805, filed on Sep. 27, 2019, now Pat. No. 10,985,197.

(58) Field of Classification Search
CPC ......... H01L 27/14609; H01L 27/14603; H01L 27/14638; H01L 27/14812
See application file for complete search history.

(56) References Cited

U.S. PATENT DOCUMENTS

| | | |
|---|---|---|
| 2008/0029787 A1 | 2/2008 | Watanabe et al. |
| 2010/0026864 A1 | 2/2010 | Lim |
| 2014/0043510 A1 | 2/2014 | Kasuga et al. |
| 2014/0103400 A1 | 4/2014 | Sakata et al. |
| 2014/0326295 A1 | 11/2014 | Moslehi |
| 2015/0076500 A1 | 3/2015 | Sakaida et al. |
| 2015/0109503 A1 | 4/2015 | Mori et al. |
| 2015/0137199 A1 | 5/2015 | Mori et al. |
| 2016/0079297 A1 | 3/2016 | Sato et al. |
| 2016/0190188 A1 | 6/2016 | Murakami et al. |
| 2016/0191825 A1 | 6/2016 | Sato et al. |
| 2017/0250216 A1 | 8/2017 | Sato et al. |
| 2017/0263669 A1 | 9/2017 | Tamaki et al. |
| 2018/0083004 A1* | 3/2018 | Sato ................. H01L 27/14612 |
| 2019/0027524 A1 | 1/2019 | Sato et al. |
| 2019/0035842 A1 | 1/2019 | Hirase et al. |
| 2019/0214427 A1 | 7/2019 | Nozawa et al. |
| 2019/0371840 A1 | 12/2019 | Hirase et al. |

FOREIGN PATENT DOCUMENTS

| | | |
|---|---|---|
| JP | 2018-050035 A | 3/2018 |
| WO | 2012/147302 A1 | 11/2012 |
| WO | 2013/190759 A1 | 12/2013 |
| WO | 2014/002330 A1 | 1/2014 |

OTHER PUBLICATIONS

Notice of Allowance issued in U.S. Appl. No. 16/586,805, dated Dec. 24, 2020.

Non-Final Office Action issued in U.S. Appl. No. 17/191,437, dated May 24, 2022.

Final Office Action issued in U.S. Appl. No. 17/191,437, dated Dec. 8, 2022.

Notice of Allowance issued in U.S. Appl. No. 17/191,437, dated Mar. 15, 2023.

* cited by examiner

IMAGING DEVICE

This application is a Continuation Application of U.S. patent application Ser. No. 17/191,437, filed Mar. 3, 2021, which is a Continuation Application of U.S. patent application Ser. No. 16/586,805, now U.S. Pat. No. 10,985,197, filed on Sep. 27, 2019, which claims the benefit of Japanese Application No. 2018-194571, filed on Oct. 15, 2018, the disclosures of which are incorporated herein by reference.

BACKGROUND

1. Technical Field

The present disclosure relates to an imaging device.

2. Description of the Related Art

Charge-coupled device (CCD) image sensors and complementary metal-oxide semiconductor (CMOS) image sensors are widely used in digital cameras and so on. These image sensors have photodiodes in semiconductor substrates.

For example, an imaging device having a structure in which photoelectric converters having a photoelectric conversion layer are arranged at the upper side of a semiconductor substrate has been proposed, as disclosed in International Publication No. 2012/147302. An imaging device having such a structure may be called a lamination type imaging device. In the lamination type imaging device, charges generated by photoelectric conversion are accumulated in corresponding charge accumulation regions provided in a semiconductor substrate. Signals corresponding to the amount of charge accumulated in each charge accumulation region are read by a CCD circuit or CMOS circuit formed on the semiconductor substrate.

In the imaging device having the charge accumulation regions in the semiconductor substrate, leakage current caused in each charge accumulation region may lead to a deterioration in the quality of images.

SUMMARY

An imaging device according to one aspect of the present disclosure includes: a photoelectric converter that converts light into a charge; a first diffusion region of a first conductivity type to which the charge is input; a second diffusion region of the first conductivity type; a first plug that has a first surface directly connected to the first diffusion region; and a second plug that has a second surface directly connected to the second diffusion region, where an area of the second surface of the second plug is larger than an area of the first surface of the first plug in a plan view.

It should be noted that general or specific embodiments may be implemented as an element, a device, a module, a system, or a method. It should also be noted that general or specific embodiments may be implemented as any selective combination of an element, a device, a module, a system, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Brief Overview of the Present Disclosure

Figure 1:
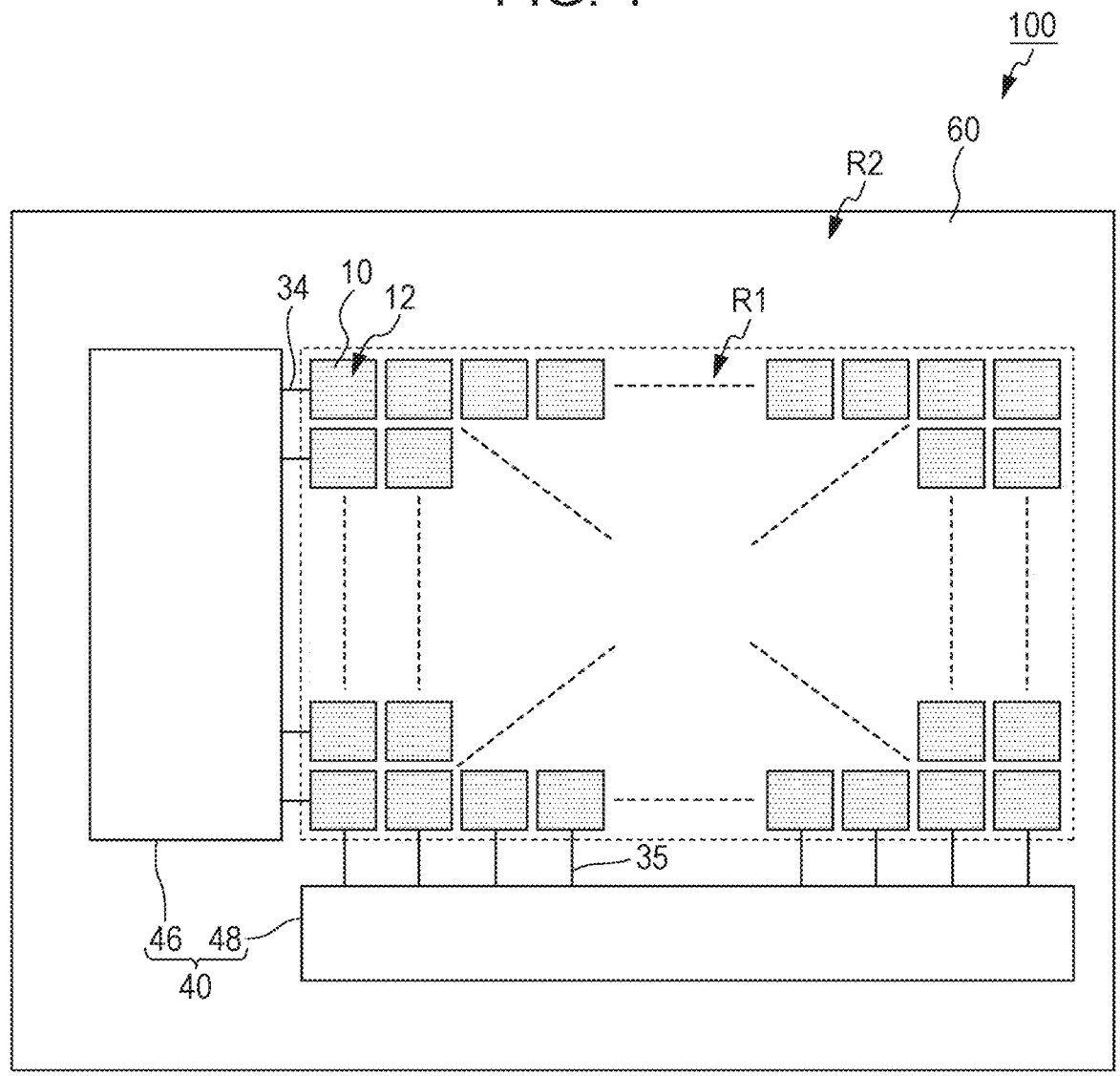
FIG. 1 is a diagram illustrating the configuration of an imaging device according to a first embodiment.

An overview of one aspect of the present disclosure will be described below.

An imaging device according to one aspect of the present disclosure includes: a semiconductor substrate including a first diffusion region of a first conductivity type and a second diffusion region of the first conductivity type; a first plug that is connected to the first diffusion region and that contains a semiconductor; a second plug that is connected to the second diffusion region and that contains a semiconductor; and a photoelectric converter that is electrically connected to the first plug. An area of the second plug is larger than an area of the first plug in a plan view.

Leakage current due to defects is likely to be caused at the surface of a semiconductor substrate. The larger a depletion layer that extends along the surface of the semiconductor substrate is, the more likely the leakage current is to be caused. In contrast, in the imaging device according to this aspect, the area of the first plug electrically connected to the photoelectric converter decreases, and thus a range affected by an electrical potential at the first plug is reduced at the surface of the semiconductor substrate. Accordingly, it is possible to suppress extension of the depletion layer from the first diffusion region along the surface of the semiconductor substrate. Thus, in the imaging device according to this aspect, leakage current, that is, dark current, can be suppressed or reduced.

In addition, for example, the imaging device according to one aspect of the present disclosure may further include an insulating film located on the semiconductor substrate. The first plug may include a first contact that is connected to the first diffusion region and that penetrates the insulating film, and a first pad that is on the first contact and that has a larger area than an area of the first contact in the plan view. The second plug may include a second contact that is connected to the second diffusion region and that penetrates the insulating film, and a second pad that is on the second contact and that has a larger area than an area of the second contact in the plan view. The area of the second pad may be larger than the area of the first pad in the plan view.

This reduces the area of the first pad for the first plug connected to the first diffusion region, thus reducing the range affected by the potential at the first pad. Thus, it is possible to suppress extension of the depletion layer from the first diffusion region along the surface of the semiconductor substrate. Accordingly, it is possible to suppress leakage current from the first diffusion region or leakage current to the first diffusion region.

In addition, for example, the imaging device according to one aspect of the present disclosure may further include: a first transistor that includes the first diffusion region as one of a source and a drain and that includes a first gate; and a second transistor that includes the second diffusion region as one of a source and a drain and that includes a second gate. A dimension of the second pad in a direction parallel to a width direction of the second gate may be larger than a dimension of the first pad in a direction parallel to a width direction of the first gate.

The reduced length in the width direction enables the area of the first pad to be easily reduced.

Also, for example, a distance between the second pad and the second gate may be larger than a distance between the first pad and the first gate.

This reduces the distance between the first pad and a gate electrode, thus making it possible to suppress extension of a depletion layer formed adjacent to the gate electrode. Accordingly, it is possible to suppress or reduce leakage current from the first diffusion region or leakage current to the first diffusion region.

Also, for example, the area of the second contact may be larger than the area of the first contact in the plan view.

This reduces the contact area where the first contact for the first plug and the first diffusion region contact each other, thus making it possible to reduce the amount of an impurity diffusing from the first contact into the first diffusion region, the impurity being contained in the first contact. Since the concentration of the impurity at a junction between the first contact and the first diffusion region decreases, an electric field strength at the junction can be attenuated. This can suppress extension of the depletion layer from the first diffusion region, thus making it possible to suppress or reduce leakage current.

Also, for example, the first plug may contain a first impurity of the first conductivity type, the second plug may contain a second impurity of the first conductivity type, and a concentration of the second impurity in the second plug may be higher than a concentration of the first impurity in the first plug.

This reduces the concentration of the impurity contained in the first plug, thus making it possible to reduce the amount of the impurity diffusing into the first diffusion region, the impurity being contained in the first plug. Since the concentration of the impurity at a junction in the first diffusion region decreases, an electric field strength at the junction can be attenuated. This can suppress extension of the depletion layer from the first diffusion region, thus making it possible to suppress or reduce leakage current.

Also, for example, the imaging device may further include: a first transistor that includes the first diffusion region as one of a source and a drain and that includes a first gate; and a second transistor that includes the second diffusion region as one of a source and a drain and that includes a second gate. A dimension of the second pad in a direction parallel to a length direction of the second gate may be larger than a dimension of the first pad in a direction parallel to a length direction of the first gate. The length direction of each gate in the plan view is a direction orthogonal to the width direction of the gate.

In the present disclosure, all or a part of any of circuits, units, devices, parts, or portions or any of functional blocks in the block diagrams may be implemented as one or more of electronic circuits including, but not limited to, a semiconductor device, a semiconductor integrated circuit (IC), or a large-scale integration (LSI). The LSI or IC can be integrated into one chip or also can be a combination of a plurality of chips. For example, functional blocks other than a memory may be integrated into one chip. Although the name used here is an LSI or IC, it may also be called a system LSI, a very large scale integration (VLSI), or an ultra large scale integration (ULSI) depending on the degree of integration. A field programmable gate array (FPGA) that can be programmed after manufacturing an LSI or a reconfigurable logic device that allows reconfiguration of the connection or setup of circuit cells inside the LSI can also be used for the same purpose.

Further, the functions or operations of all or a part of the circuits, units, devices, parts, or portions can be implemented by executing software. In such a case, the software is recorded on one or more non-transitory recording media, such as a ROM, an optical disk, or a hard disk drive, and when the software is executed by a processor, the software causes the processor together with peripheral devices to execute the functions specified in the software. A system, an apparatus, or a device may include such one or more non-transitory recording media on which the software is recorded and a processor together with necessary hardware devices such as an interface.

Embodiments of the present disclosure will be described in detail with reference to the accompanying drawings. The embodiments described below each represent a general or specific example. Numerical values, shapes, materials, constituent elements, the arrangement and the connections of constituent elements, steps, the order of steps, and so on described in the embodiments below are examples and are not intended to limit the present disclosure. Various aspects described herein can be combined together, as long as such a combination does not cause contradiction. Also, of the constituent elements in the embodiments below, constituent elements not set forth in the independent claim will be described as optional constituent elements. In the drawings, constituent elements having substantially the same functions are denoted by the same reference numerals, and redundant descriptions may be omitted or be briefly given.

Various elements illustrated in the drawings are merely schematically illustrated for understanding of the present disclosure, and dimensional ratios, external appearances, and so on may differ from those of actual elements. That is, the drawings are schematic diagrams and are not necessarily strictly illustrated. Accordingly, for example, scales and so on do not necessarily match in each drawing.

Herein, the terms "parallel", "match", and so on representing relationships between elements, terms representing element shapes, such as "circular shape" and "rectangular shape", and the ranges of numerical values are not only expressions representing exact meanings but also expressions representing substantially equivalent terms and ranges, for example, expressions meaning that the terms include, for example, differences of about several percent.

Herein, the terms "upper side" and "lower side" do not refer to an upper direction (vertically upper side) and a lower direction (vertically lower side) in absolute spatial recognition and are used as terms defined by relative positional relationships based on the order of laminated layers in a laminated configuration. Specifically, the light receiving side of an imaging device is referred to as the "upper side", and the opposite side of the light receiving side is referred to as the "lower side". Similarly, with respect to an "upper surface" and a "lower surface" of each member, a surface that opposes the light receiving side of the imaging device is referred to as an "upper surface", and a surface that opposes the light receiving side at its opposite side is referred to as a "lower surface". The terms "upper side", "lower side", "upper surface", "lower surface", and so on are used to merely designate mutual arrangements among members and are not intended to limit orientations during use of the imaging device. The terms "upper side" and "lower side" apply to not only cases in which a constituent element exists between two constituent elements arranged with a gap therebetween and but also cases in which two constituent elements are arranged in close contact with each other. In addition, the term "plan view" refers to a view from a direction orthogonal to a semiconductor substrate.

First Embodiment

FIG. 1 is a diagram illustrating the configuration of an imaging device according to a first embodiment. As illustrated in FIG. 1, an imaging device 100 according to the first embodiment has a plurality of pixels 10 and peripheral circuitry 40 that are formed on a semiconductor substrate 60. Each pixel 10 includes a photoelectric converter 12 arranged at the upper side of the semiconductor substrate 60. That is, the imaging device 100, which is a lamination type, will now be described as one example of an imaging device according to the present disclosure.

In the example illustrated in FIG. 1, the pixels 10 are arranged in a matrix with m rows and n columns. In this case, m and n are each an integer greater than or equal to 2. The pixels 10 are, for example, two-dimensionally arranged on the semiconductor substrate 60 to thereby form an image capture region R1. As described above, each pixel 10 includes the photoelectric converter 12 arranged at the upper side of the semiconductor substrate 60. Thus, the image capture region R1 can be defined as a region located at the upper side of the semiconductor substrate 60 and covered by the photoelectric converters 12. Although, in FIG. 1, the photoelectric converters 12 in the pixels 10 are illustrated as being spatially separated from each other for the sake of ease of description, the photoelectric converters 12 in the pixels 10 may be arranged at the upper side of the semiconductor substrate 60 without gaps therebetween.

The number of pixels 10 and the arrangement thereof are not limited to the illustrated example. For example, the number of pixels 10 included in the imaging device 100 may be one. Although, in this example, the centers of the respective pixels 10 are located on grid points of a square grid, the arrangement of the pixels 10 may be different therefrom. For example, the pixels 10 may be arranged so that the centers thereof are located on grid points of a triangular grid, a hexagonal grid, or the like. Also, for example, when the pixels 10 are one-dimensionally arrayed, the imaging device 100 can be used as a line sensor.

In the configuration illustrated in FIG. 1, the peripheral circuitry 40 includes a vertical scanning circuit 46 and a horizontal signal reading circuit 48. The vertical scanning circuit 46 is also called a row scanning circuit and has connections with address signal lines 34 provided corresponding to respective rows of the pixels 10. The horizontal signal reading circuit 48 is also called a column scanning circuit and has connections with vertical signal lines 35 provided corresponding to respective columns of the pixels 10. As schematically illustrated in FIG. 1, these circuits are arranged in a peripheral region R2 outside the image capture region R1. The peripheral circuitry 40 may further include a signal processing circuit, an output circuit, a control circuit, a power supply for supplying a predetermined voltage to the pixels 10, and so on. A portion of the peripheral circuitry 40 may be arranged on another substrate that is different from the semiconductor substrate 60 where the pixels 10 are formed.

Figure 2:
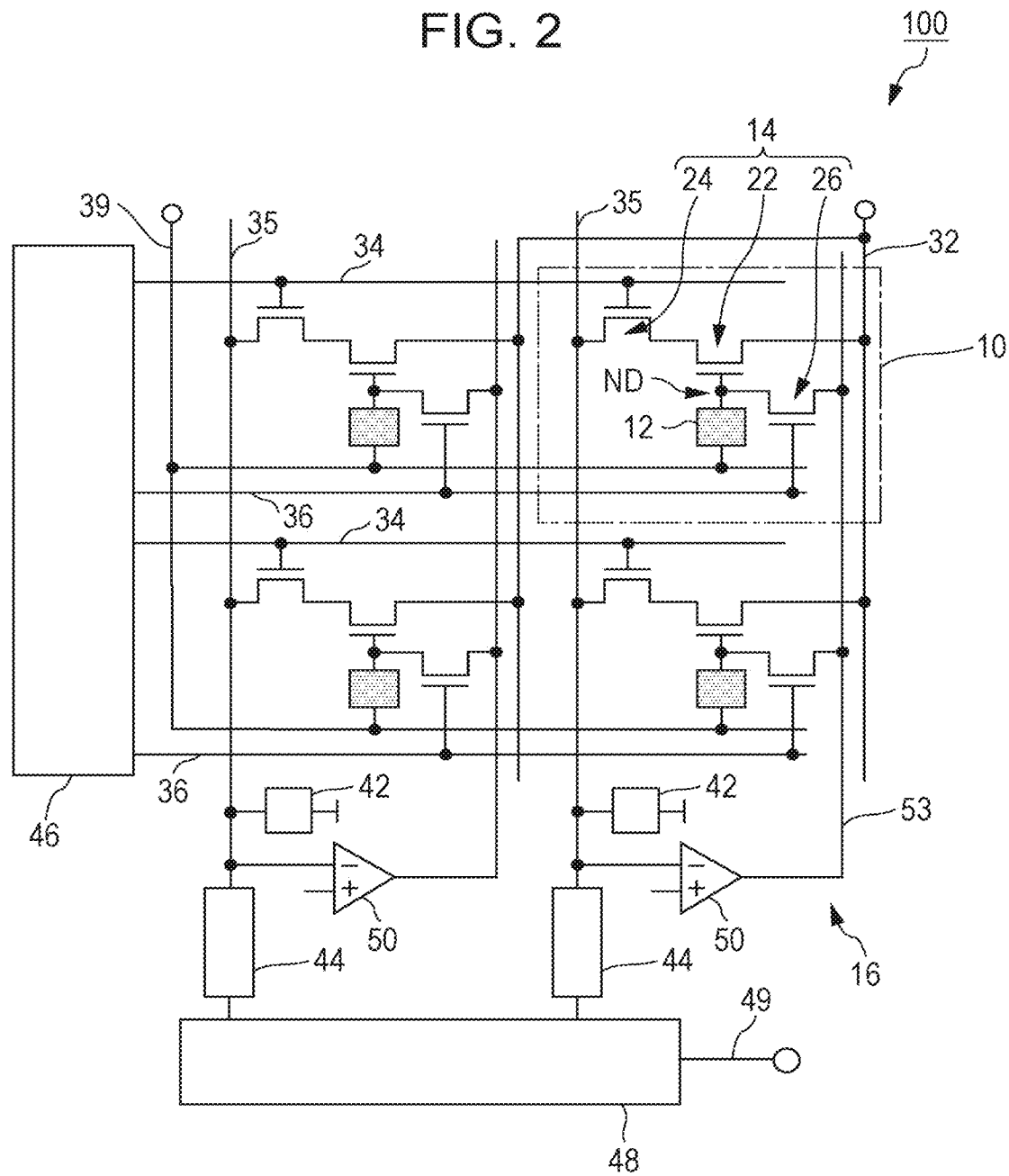
FIG. 2 is a diagram illustrating a circuit configuration of the imaging device according to the first embodiment.

FIG. 2 is a diagram illustrating a circuit configuration of the imaging device 100 according to the present embodiment. Of the plurality of pixels 10 illustrated in FIG. 1, four pixels 10 arrayed in 2 rows and 2 columns are illustrated in FIG. 2 in order to avoid complicating the drawing.

Upon light incidence, the photoelectric converter 12 in each pixel 10 generates positive and negative charges, typically, electron-hole pairs. The photoelectric converter 12 in each pixel 10 has a connection with an accumulation control line 39, and during operation of the imaging device 100, a predetermined voltage is applied to the accumulation control line 39. Applying a predetermined voltage to the accumulation control line 39 allows one of the positive and negative charges generated by photoelectric conversion to be selectively accumulated in a charge accumulation region. The following description will be given of an example of a case in which, of the positive and negative charges generated by photoelectric conversion, the positive charge is used as signal charge.

Each pixel 10 includes a signal detection circuit 14 electrically connected to the photoelectric converter 12. In the configuration illustrated in FIG. 2, the signal detection circuit 14 includes an amplifying transistor 22 and a reset transistor 26. In this example, the signal detection circuit 14 further includes an address transistor 24. As described below in detail with reference to the drawings, the amplifying transistor 22, the reset transistor 26, and the address transistor 24 in the signal detection circuit 14 are, typically, field-effect transistors (FETs) formed on the semiconductor substrate 60, which supports the photoelectric converter 12. An example in which N-channel metal-oxide-semiconductor field-effect transistors (MOSFETs) are used as the transistors will be described below, unless otherwise particularly stated. Which of two diffusion regions for each FET correspond to a source and a drain, respectively, are determined by the polarity of the FET and a potential level at a particular point in time. Thus, which of two diffusion regions is a source or a drain can vary depending on the operating state of each FET.

As schematically illustrated in FIG. 2, a gate of the amplifying transistor 22 is electrically connected to the photoelectric converter 12. Signal charge generated by the photoelectric converter 12 is accumulated in a charge accumulation region connected to a charge accumulation node ND between the photoelectric converter 12 and the amplifying transistor 22. The charge accumulation node ND corresponds to the charge accumulation region and a wire that provides electrical connection between the charge accumulation region and the gate of the amplifying transistor 22 and a lower electrode of the photoelectric converter 12.

A drain of the amplifying transistor 22 is connected to a power-supply wire 32, which supplies a predetermined power-supply voltage VDD to the corresponding pixels 10 during operation of the imaging device 100. A power supply (not illustrated) connected to the power-supply wire 32 is also called a source-follower power supply. The power-supply voltage VDD is, for example, about 3.3 V, but is not limited thereto. The amplifying transistor 22 outputs a signal voltage corresponding to the amount of signal charge generated by the photoelectric converter 12. A source of the amplifying transistor 22 is connected to the drain of the address transistor 24.

Each vertical signal line 35 is connected to the sources of the corresponding address transistors 24. As illustrated in FIGS. 1 and 2, the vertical signal lines 35 are provided for the respective columns of the pixels 10, and load circuits 42 and column signal processing circuits 44 are connected to the corresponding vertical signal lines 35. Each load circuit 42, together with the corresponding amplifying transistor 22, forms a source follower circuit.

The address signal lines 34 are connected to the gate of the corresponding address transistors 24. The address signal lines 34 are provided for the respective rows of the pixels 10. The address signal lines 34 are connected to the vertical scanning circuit 46, and the vertical scanning circuit 46 applies a row selection signal for controlling on and off states of the address transistors 24 to each address signal line 34. As a result, a row to be read is scanned in a column direction, which is a vertical direction, and the row to be read is selected. By controlling the on and off states of the address transistors 24 through each address signal line 34, the vertical scanning circuit 46 allows outputs of the amplifying transistors 22 in the selected pixels 10 to be read out to the corresponding vertical signal lines 35. The arrangement of the address transistors 24 is not limited to the example illustrated in FIG. 2, and each address transistor 24 may be arranged between the drain of the amplifying transistor 22 and the power-supply wire 32.

Signal voltages from the pixels 10, the signal voltages being output to each vertical signal line 35 via the address transistors 24, are input to a corresponding column signal processing circuit 44 of a plurality of column signal processing circuits 44, which are provided for the respective columns of the pixels 10 so as to correspond to the vertical signal lines 35. The column signal processing circuits 44 and the load circuits 42 may be portions of the above-described peripheral circuitry 40.

Each column signal processing circuit 44 performs noise-suppression signal processing, typified by correlated double sampling, analog-to-digital conversion, and so on. The column signal processing circuits 44 are connected to the horizontal signal reading circuit 48. The horizontal signal reading circuit 48 sequentially reads out signals from the column signal processing circuits 44 to a horizontal common signal line 49.

In the configuration illustrated in FIG. 2, a drain of the reset transistor 26 included in each signal detection circuit 14 is connected to the corresponding charge accumulation node ND. Reset signal lines 36, which have connections with the vertical scanning circuit 46, are connected to gates of the reset transistors 26. The reset signal lines 36 are provided for the respective rows of the pixels 10, similarly to the address signal lines 34. By applying a row selection signal to the address signal line 34, the vertical scanning circuit 46 can select the pixels 10 to be reset for each row. Also, by applying a reset signal for controlling on and off states of the reset transistors 26 to the gates of the reset transistors 26 through the reset signal line 36, the vertical scanning circuit 46 can turn on the reset transistors 26 in the selected row. When the reset transistors 26 are turned on, potentials at the corresponding charge accumulation nodes ND are reset.

In this example, a source of each reset transistor 26 is connected to one of feedback lines 53, which are provided for the respective columns of the pixels 10. That is, in this example, a voltage in each feedback line 53 is supplied to the corresponding charge accumulation nodes ND as a reset voltage for initializing charges in the photoelectric converters 12. In this case, the above-described feedback line 53 is connected to an output terminal of a corresponding one of the inverting amplifiers 50 provided for the respective columns of the pixels 10. The inverting amplifiers 50 may be portions of the above-described peripheral circuitry 40.

Attention is given to one of the columns of the pixels 10. As illustrated in FIG. 2, an inverting input terminal of each inverting amplifier 50 is connected to the vertical signal line 35 in the corresponding column. An output terminal of the inverting amplifier 50 and one or more pixels 10 belonging to the column are connected through the feedback line 53. During operation of the imaging device 100, a predetermined voltage Vref is supplied to non-inverting input terminals of the inverting amplifiers 50. When one of one or more pixels 10 belonging to the column is selected, and the address transistor 24 and the reset transistor 26 in the selected pixel 10 are turned on, a feedback path through which an output of the pixel 10 is negatively fed back can be formed. As a result of the formation of the feedback path, a voltage of the corresponding vertical signal line 35 converges to the voltage Vref input to the non-inverting input terminal of the inverting amplifier 50. In other words, as a result of the formation of the feedback path, a voltage at the charge accumulation node ND is reset to a voltage at which the voltage of the vertical signal line 35 reaches the voltage Vref. A voltage with an arbitrary value in the range between a power-supply voltage and a ground voltage is used as the voltage Vref. For example, the voltage Vref may be a voltage in a range that is 0 V or more and 3.3 V or less. One example of the voltage Vref is a positive voltage of 1 V or around 1 V. The inverting amplifier 50 may be called a feedback amplifier. As described above, the imaging device 100 has feedback circuits 16, which include inverting amplifiers 50 in portions of their feedback paths.

As is well known, thermal noise called kTC noise is generated in response to turning on or off of a transistor. Noise that is generated when each reset transistor 26 is turned on or off is called reset noise. After the potential in the charge accumulation region is reset, reset noise generated by turning off the reset transistor 26 remains in the charge accumulation region in which signal charge is accumulated. However, the reset noise that is generated when the reset transistor 26 is turned off can be reduced using the feedback circuit 16. Details of reset noise suppression utilizing the feedback circuit 16 are described in International Publication No. 2012/147302. The entire contents disclosed in International Publication No. 2012/147302 are incorporated herein by reference.

In the configuration illustrated in FIG. 2, as a result of the formation of the feedback path, alternating-current components of thermal noise are fed back to the source of the reset transistor 26. In the configuration illustrated in FIG. 2, since the feedback path is formed until immediately before the reset transistor 26 is turned off, it is possible to reduce reset noise that is generated when the reset transistor 26 is turned off.

Figure 3:
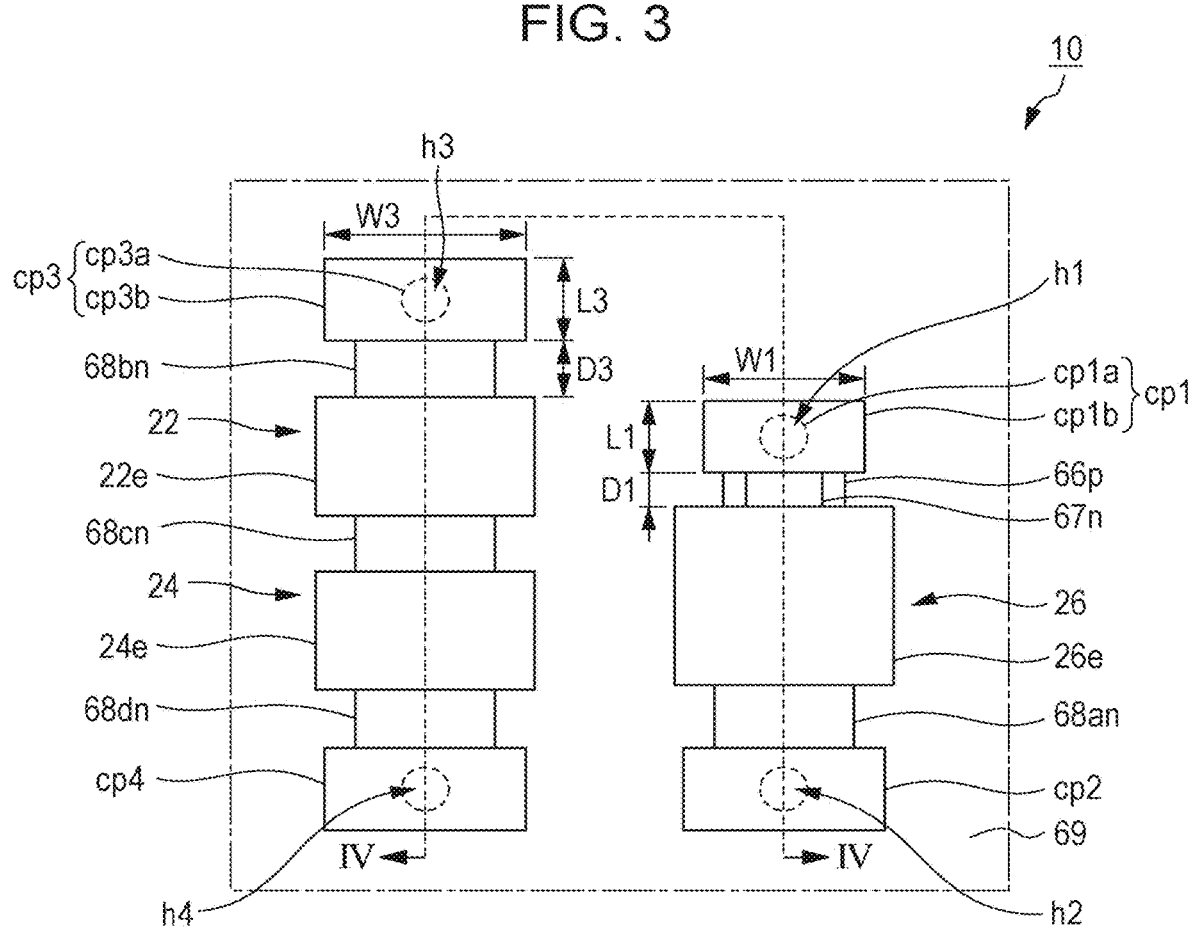
FIG. 3 is a plan view illustrating a layout in one pixel in the imaging device according to the first embodiment.
Figure 4:
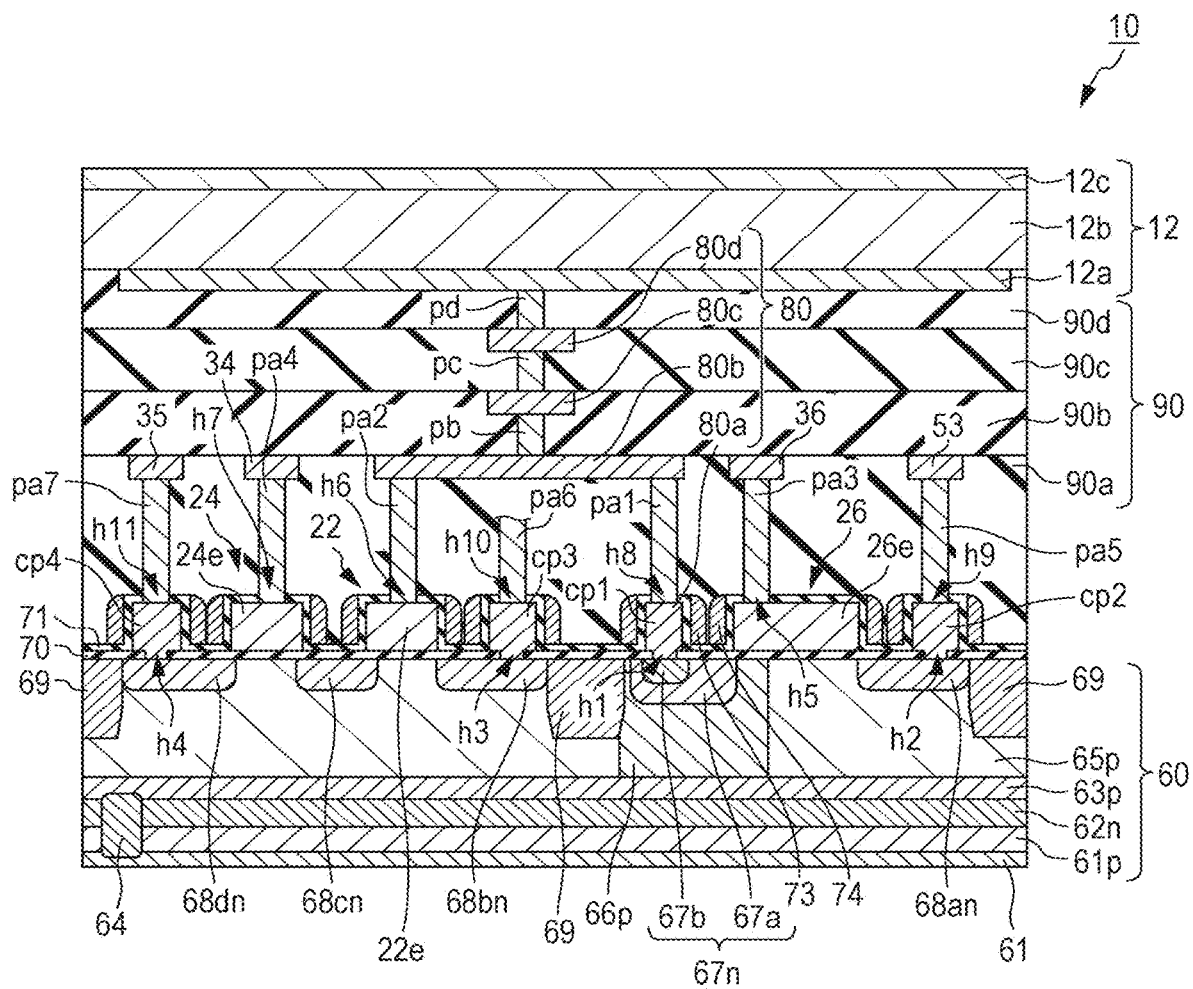
FIG. 4 is a schematic sectional view illustrating a device structure of one pixel in the imaging device according to the first embodiment.

FIG. 3 is a plan view illustrating a layout in one pixel 10 in the imaging device 100 according to the present embodiment. FIG. 3 schematically illustrates individual elements formed on the semiconductor substrate 60 when the pixel 10 illustrated in FIG. 4 is viewed from a direction orthogonal to the semiconductor substrate 60. Specifically, FIG. 3 illustrates the arrangement of the amplifying transistor 22, the address transistor 24, and the reset transistor 26 included in one pixel 10. In this case, the amplifying transistor 22 and the address transistor 24 are linearly arranged along up-and-down directions in the plane of the figure.

FIG. 4 is a schematic sectional view illustrating a device structure of one pixel 10 in the imaging device 100 according to the present embodiment. FIG. 4 is a sectional view when the pixel 10 is cut along line IV-IV in FIG. 3 and extended in arrow directions.

In FIGS. 3 and 4, a first diffusion region 67n, which is an n-type impurity region, is a drain region of the reset transistor 26 and is a charge accumulation region.

As illustrated in FIGS. 3 and 4, the reset transistor 26 included in the pixel 10 in the imaging device 100 according to the present embodiment contains an impurity of a first conductivity type, includes, as one of a source and a drain, the first diffusion region 67n in which signal charge converted by the photoelectric converter 12 is accumulated, and includes, as the other of the source and the drain, a second diffusion region 68an containing an impurity of the first conductivity type. The reset transistor 26 is one example of a first transistor that includes a first diffusion region as one of a source and a drain and that includes a first gate.

In the present embodiment, the first conductivity type is an n-type. That is, the first diffusion region 67n and the second diffusion region 68an are n-type impurity regions. For example, the concentration of an n-type impurity in the first diffusion region 67n is lower than the concertation of an n-type impurity in the second diffusion region 68an. The first diffusion region 67n and the second diffusion region 68an are provided at mutually different positions in the semiconductor substrate 60.

As described above, the pixel 10 includes the amplifying transistor 22 and the address transistor 24. The amplifying transistor 22 and the address transistor 24 are each one example of a second transistor that includes the second diffusion region as one of a source and a drain and that includes a second gate. The amplifying transistor 22 includes, as one of a source and a drain, a second diffusion region 68bn containing an n-type impurity and includes, as the other of the source and the drain, a third diffusion region 68cn containing an n-type impurity. The address transistor 24 includes, as one of a source and a drain, a second diffusion region 68dn containing an n-type impurity and includes, as the other of the source and the drain, the third diffusion region 68cn containing an n-type impurity. The second diffusion regions 68bn and 68dn and the third diffusion region 68cn are examples of n-type impurity regions provided at different positions in the semiconductor substrate 60.

In this case, the concentration of the n-type impurity in the first diffusion region 67n may be lower than the concentration of the n-type impurity in each of the second diffusion regions 68bn and 68dn and the third diffusion region 68cn. This reduces a junction concentration at a junction between the first diffusion region 67n and the semiconductor substrate 60, thus making it possible to attenuate the electric field strength at the junction. Thus, leakage current from the first diffusion region 67n, which is a charge accumulation region, or leakage current to the first diffusion region 67n is reduced.

In the imaging device 100 according to the present embodiment, the semiconductor substrate 60 contains an impurity of the second conductivity type. The second conductivity type is a conductivity type different from the first conductivity type and is a p-type in the present embodiment. The concentration of the n-type impurity contained in the first diffusion region 67n and the concentration of the p-type impurity contained in the semiconductor substrate 60 may be, for example, higher than or equal to $1 \times 10^{16}$ atoms/cm$^3$ and lower than or equal to $5 \times 10^{16}$ atoms/cm$^3$. This reduces the junction concentration at the junction between the first diffusion region 67n and the semiconductor substrate 60, thus making it possible to suppress an increase in the electric field strength at the junction. Thus, it is possible to reduce the leakage current at the junction.

As schematically illustrated in FIG. 4, the pixel 10 generally includes a portion of the semiconductor substrate 60, the photoelectric converter 12 arranged at the upper side of the semiconductor substrate 60, and a wiring structure 80. The wiring structure 80 is arranged in an interlayer insulating layer 90 formed between the photoelectric converter 12 and the semiconductor substrate 60 and includes a structure that provides electrical connection between the amplifying transistor 22 formed on the semiconductor substrate 60 and the photoelectric converter 12. In this case, the interlayer insulating layer 90 has a laminated structure including four insulating layers 90a, 90b, 90c, and 90d. The wiring structure 80 has four wiring layers 80a, 80b, 80c, and 80d and plugs pa1, pa2, pa3, pa4, pa5, pa6, pa7, pb, pc, and pd arranged in the wiring layers 80a, 80b, 80c, and 80d.

Of the plurality of wiring layers 80a, 80b, 80c, and 80d included in the wiring structure 80, the wiring layer 80a is a layer that is the closest to the semiconductor substrate 60. Specifically, the wiring layer 80a includes contact plugs cp1, cp2, cp3, and cp4 and gate electrodes 22e, 24e, and 26e. Needless to say, the number of insulating layers in the interlayer insulating layer 90 and the number of wiring layers in the wiring structure 80 are not limited to this example and may be arbitrarily set.

The photoelectric converter 12 is arranged on the interlayer insulating layer 90. The photoelectric converter 12 includes a pixel electrode 12a formed on the interlayer insulating layer 90, a transparent electrode 12c that opposes the pixel electrode 12a, and a photoelectric conversion layer 12b arranged between the pixel electrode 12a and the transparent electrode 12c. The photoelectric conversion layer 12b in the photoelectric converter 12 is formed of organic material or inorganic material, such as amorphous silicon, and generates positive and negative charges through photoelectric conversion in response to light that is incident via the transparent electrode 12c. Typically, the photoelectric conversion layer 12b is continuously formed across the plurality of pixels 10. In plan view, the photoelectric conversion layer 12b is formed in one plate shape that covers most of the image capture region R1 on the semiconductor substrate 60. That is, the photoelectric conversion layer 12b is shared by two or more pixels 10. In other words, the photoelectric converters 12 provided in the respective pixels 10 have portions that are included in the photoelectric conversion layer 12b and that differ from one pixel 10 to another. The photoelectric conversion layer 12b may also include a layer constituted by organic material and a layer constituted by inorganic material. The photoelectric conversion layer 12b may be separated and be provided for each pixel 10.

The transparent electrode 12c is formed of a transparent conductive material, such as an indium tin oxide (ITO), and is arranged at a light-receiving surface side of the photoelectric conversion layer 12b. Typically, the transparent electrode 12c is continuously formed across two or more pixels 10, similarly to the photoelectric conversion layer 12b. That is, the transparent electrode 12c is shared by two or more pixels 10. In other words, the photoelectric converters 12 provided in the respective pixels 10 have portions that are included in the transparent electrodes 12c and that differ from one pixel 10 to another. The transparent electrode 12c may be separated and be provided for each pixel 10.

Although not illustrated in FIG. 4, the transparent electrode 12c has a connection with the above-described accumulation control line 39. During operation of the imaging device 100, when the potential of the accumulation control line 39 is controlled to make the potential at the transparent electrode 12c and the potential at the pixel electrode 12a differ from each other, the pixel electrode 12a can collect signal charge generated by photoelectric conversion. For example, the potential of the accumulation control line 39 is controlled so that the potential at the transparent electrode 12c becomes higher than the potential at the pixel electrode 12a. Specifically, for example, a positive voltage of about 10 V is applied to the accumulation control line 39. This allows the pixel electrode 12a to collect holes of electron-hole pairs, generated in the photoelectric conversion layer 12b, as signal charge. The signal charge collected by the pixel electrode 12a is accumulated in the first diffusion region 67n via the wiring structure 80.

The pixel electrode 12a is formed of metal, such as aluminum or copper, a metal nitride, or polysilicon or the like given conductivity by impurity doping. Each pixel electrode 12a is spatially separated from the pixel electrodes 12a in the other adjacent pixels 10 and is thus electrically isolated from the pixel electrodes 12a in the other pixels 10.

As illustrated in FIG. 4, the semiconductor substrate 60 includes a supporting substrate 61 and one or more semiconductor layers formed on the supporting substrate 61. In this case, a description will be given of an example in which the supporting substrate 61 is a p-type silicon (Si) substrate. In this example, the semiconductor substrate 60 has a p-type semiconductor layer 61p on the supporting substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed on an entire surface of the supporting substrate 61. The p-type semiconductor layer 65p has a p-type impurity region 66p having a lower impurity concentration than the p-type semiconductor layer 65p, the first diffusion region 67n formed in the p-type impurity region 66p, the second diffusion regions 68an, 68bn, and 68dn, the third diffusion region 68cn, and an element isolation region 69.

Each of the p-type semiconductor layers 61p, 63p, and 65p and the n-type semiconductor layer 62n is typically formed by ion-implanting an impurity into a semiconductor layer formed by epitaxial growth. The impurity concentrations of the p-type semiconductor layers 63p and 65p are approximately the same and are higher than the impurity concentration of the p-type semiconductor layer 61p. The n-type semiconductor layer 62n arranged between the p-type semiconductor layers 61p and 63p suppresses or reduces flow of minority carriers from the supporting substrate 61 or the peripheral circuitry 40 into the first diffusion region 67n, which is a charge accumulation region in which signal charge is accumulated. During operation of the imaging device 100, the potential in the n-type semiconductor layer 62n is controlled via a well contact (not illustrated) provided outside the image capture region R1 illustrated in FIG. 1.

In this example, the semiconductor substrate 60 has a p-type region 64 provided between the p-type semiconductor layer 63p and the supporting substrate 61 so as to penetrate the p-type semiconductor layer 61p and the n-type semiconductor layer 62n. The p-type region 64 has a high impurity concentration compared with the p-type semiconductor layers 63p and 65p and provides electrical connection between the p-type semiconductor layer 63p and the supporting substrate 61. During operation of the imaging device 100, the potentials in the p-type semiconductor layer 63p and the supporting substrate 61 are controlled via substrate contacts (not illustrated) provided outside the image capture region R1. When the p-type semiconductor layer 65p is arranged so as to contact the p-type semiconductor layer 63p, the potential in the p-type semiconductor layer 65p can be controlled through the p-type semiconductor layer 63p during operation of the imaging device 100.

The amplifying transistor 22, the address transistor 24, and the reset transistor 26 are formed on the semiconductor substrate 60. The reset transistor 26 includes the first diffusion region 67n, the second diffusion region 68an, a portion of an insulating layer 70 formed on the semiconductor substrate 60, and the gate electrode 26e on the insulating layer 70. The gate electrode 26e is one example of the first gate and specifically functions as the gate of the reset transistor 26. The first diffusion region 67n and the second diffusion region 68an function as a drain region and a source region, respectively, of the reset transistor 26. The first diffusion region 67n functions as a charge accumulation region in which signal charge generated by the photoelectric converter 12 is temporarily accumulated.

The amplifying transistor 22 includes the second diffusion region 68bn, the third diffusion region 68cn, a portion of the insulating layer 70, and the gate electrode 22e on the insulating layer 70. The gate electrode 22e is one example of the second gate and specifically functions as the gate of the amplifying transistor 22. The second diffusion region 68bn and the third diffusion region 68cn function as a drain region and a source region, respectively, of the amplifying transistor 22.

The element isolation region 69 is arranged between the second diffusion region 68bn and the first diffusion region 67n. The element isolation region 69 is, for example, a p-type impurity diffusion region. The impurity concentration of the element isolation region 69 is higher than each of the impurity concentrations of the p-type semiconductor layer 65p and the p-type impurity region 66p. The element isolation region 69 electrically isolates the amplifying transistor 22 and the reset transistor 26.

As schematically illustrated in FIG. 4, the first diffusion region 67n is formed in the p-type impurity region 66p, so that the first diffusion region 67n and the element isolation region 69 are arranged so as not to contact each other. For example, when a p-type impurity region is used as the element isolation region 69, and the first diffusion region 67n and the element isolation region 69 contact each other, both a p-type impurity concentration and an n-type impurity concentration at the junction increase. Thus, leakage current due to the high junction concentrations is likely to be generated in the surroundings of the junction between the first diffusion region 67n and the element isolation region 69. In other words, since the first diffusion region 67n and the element isolation region 69 are arranged so as not contact each other, an increase in the p-n junction concentration can be suppressed, and leakage current can be suppressed or reduced, even when a high-concentration p-type impurity is used in the element isolation region 69. Also, there is a method in which shallow trench isolation (STI) is used for the element isolation region 69, in which case, the first diffusion region 67n and the STI may be arranged so as not to contact each other in order to reduce leakage current due to defects at STI sidewall portions.

The element isolation region 69 is also arranged between the pixels 10 that are adjacent to each other and electrically isolate the signal detection circuits 14 in the pixels 10 from each other. In this case, the element isolation region 69 is provided around a pair of the amplifying transistor 22 and the address transistor 24 and around the reset transistor 26.

The address transistor 24 includes the third diffusion region 68cn, the second diffusion region 68dn, a portion of the insulating layer 70, and the gate electrode 24e on the insulating layer 70. The gate electrode 24e is one example of the second gate and specifically functions the gate of the address transistor 24. In this example, the address transistor 24, together with the amplifying transistor 22, shares the third diffusion region 68cn and is electrically connected to the amplifying transistor 22. The third diffusion region 68cn functions as the drain region of the address transistor 24, and the second diffusion region 68dn functions as the source region of the address transistor 24.

In this example, an insulating layer 71 is provided so as to cover the gate electrode 26e of the reset transistor 26, the gate electrode 22e of the amplifying transistor 22, and the gate electrode 24e of the address transistor 24. The insulating layer 71 is, for example, a silicon oxide film. The insulating layer 71 may have a laminated structure including a plurality of insulating layers.

Figure 5:
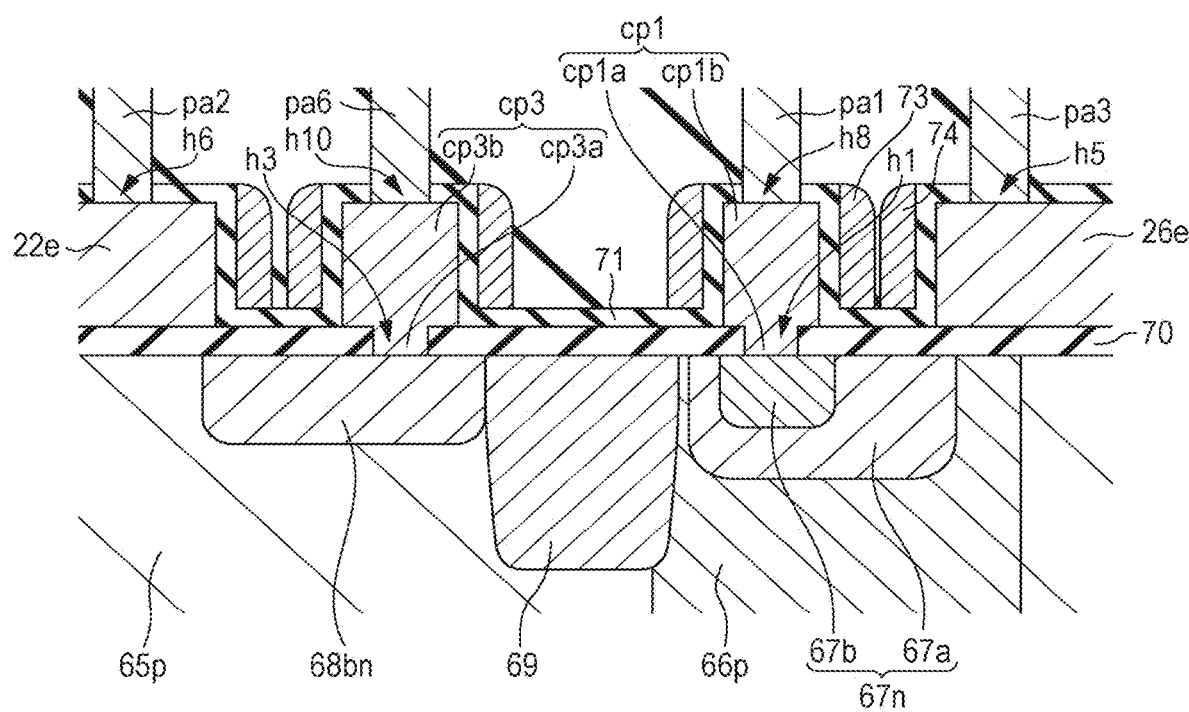
FIG. 5 is an enlarged sectional view of the vicinity of two contact plugs in the imaging device according to the first embodiment.

As illustrated in FIGS. 4 and 5, a sidewall 73 of the contact plug cp1 and a sidewall 74 of the gate electrode 26e are located on the insulating layer 71. The sidewalls 73 and 74 are formed of, for example, a silicon nitride film. The sidewalls 73 and 74 fill a portion between the contact plug cp1 and the gate electrode 26e. That is, in plan view, the sidewalls 73 and 74 cover the first diffusion region 67n at the portion between the contact plug cp1 and the gate electrode 26e.

Accordingly, compared with a case in which the first diffusion region 67n is covered by only the insulating layers 70 and 71 at the portion between the contact plug cp1 and the gate electrode 26e, it is possible to reduce damage on the first diffusion region 67n and contamination due to metal diffusion. One example of the damage on the first diffusion region 67n is damage due to plasma used in a process subsequent to formation of the first diffusion region 67n. Examples of the damage due to plasma include physical damage due to collision of accelerated ions and defects caused by light. The light is, for example, ultraviolet. In the present embodiment, the distance between a pad cp1b and the gate electrode 26e is reduced, as described below. This facilitates that the portion between the contact plug cp1 and the gate electrode 26e is filled with the sidewalls 73 and 74. The portion between the contact plug cp1 and the gate electrode 26e may be filled with only the sidewall 74 without provision of the sidewall 73. A portion between another contact plug and another gate electrode may be filled with a sidewall. In such a case, the same or similar advantages can be obtained for the other impurity regions.

The insulating layers 70 and 71 have a plurality of contact holes. In this case, as illustrated in FIG. 4, contact holes h1, h2, h3, h4, h5, h6, h7, h8, h9, h10, and h11 are provided in the insulating layers 70 and 71. The contact holes h1, h2, h3, and h4 are formed at positions where they overlap the first diffusion region 67n, the second diffusion region 68an, the second diffusion region 68bn, and the second diffusion region 68dn, respectively, in plan view. The contact holes h1 to h4 are through holes that penetrate the insulating layer 70. The contact plugs cp1 to cp4 are arranged at the positions of the contact holes h1 to h4, respectively. The film thickness of the insulating layer 70 is, for example, 10 nm, but is not limited thereto.

The contact holes h5, h6, and h7 are formed at positions where they overlap the gate electrodes 26e, 22e, and 24e, respectively, in plan view. The contact holes h5 to h7 are through holes that penetrate the insulating layer 71. The plugs pa3, pa2, and pa4 are arranged at the positions of the contact holes h5, h6, and h7, respectively.

The contact holes h8 to h11 are formed at positions where they overlap the contact plugs cp1 to cp4, respectively, in plan view. The contact holes h8 to h11 are through holes that penetrate the insulating layer 71. The plugs pa1, pa5, pa6, and pa7 are arranged at the positions of the contact holes h8, h9, h10, and h11, respectively.

In the configuration illustrated in FIG. 4, the wiring layer 80a is a layer having the contact plugs cp1 to cp4 and the gate electrodes 22e, 24e, and 26e and is typically a polysilicon layer doped with an n-type impurity. Of the wiring layers included in the wiring structure 80, the wiring layer 80a is arranged the closest to the semiconductor substrate 60.

The wiring layer 80b and the plugs pa1 to pa7 are arranged in the insulating layer 90a. The wiring layer 80b is arranged in the insulating layer 90a and may include, in its portion, the vertical signal line 35, the address signal line 34, the power-supply wire 32, the reset signal line 36, the feedback line 53, and so on.

The plug pa1 provides connection between the contact plug cp1 and the wiring layer 80b. The plug pa2 provides connection between the gate electrode 22e and the wiring layer 80b. That is, the first diffusion region 67n and the gate electrode 22e of the amplifying transistor 22 are electrically connected to each other via the contact plug cp1, the plugs pa1 and pa2, and the wiring layer 80b.

The plug pa3 provides connection between the reset signal line 36 included in the wiring layer 80b and the gate electrode 26e. The plug pa4 provides connection between the address signal line 34 included in the wiring layer 80b and the gate electrode 24e. The plug pa5 provides connection between the feedback line 53 included in the wiring layer 80b and the contact plug cp2. The plug pa6 provides connection between the power-supply wire 32 (not illustrated in FIG. 4) included in the wiring layer 80b and the contact plug cp3. The plug pa7 provides connection between the vertical signal line 35 included in the wiring layer 80b and the contact plug cp4.

In this configuration, the vertical signal line 35 is connected to the second diffusion region 68dn via the plug pa7 and the contact plug cp4. The address signal line 34 is connected to the gate electrode 24e via the plug pa4. The power-supply wire 32 is connected to the second diffusion region 68bn via the plug pa6 and the contact plug cp3. The reset signal line 36 is connected to the gate electrode 26e via the plug pa3. The feedback line 53 is connected to the second diffusion region 68an via the plug pa5 and the contact plug cp2.

At least one of the vertical signal line 35, the address signal line 34, the power-supply wire 32, the reset signal line 36, and the feedback line 53 may be included in the wiring layer 80c or 80d, not in the wiring layer 80b.

The plug pb arranged in the insulating layer 90b provides connection between the wiring layers 80b and 80c. Similarly, the plug pc arranged in the insulating layer 90c provides connection between the wiring layers 80c and 80d. The plug pd arranged in the insulating layer 90d provides connection between the wiring layer 80d and the pixel electrode 12a in the photoelectric converter 12. The wiring layers 80b to 80d and the plugs pa1 to pa7 and pb to pd are typically formed of, for example, metal such as copper or tungsten, a metal compound such as a metal nitride or a metal oxide, or the like.

The plugs pa1, pa2, and pb to pd, the wiring layers 80b to 80d, and the contact plug cp1 provide electrical connection between the photoelectric converter 12 and the signal detection circuit 14 formed on the semiconductor substrate 60. The plugs pa1, pa2, and pb to pd, the wiring layers 80b to 80d, the contact plug cp1, the pixel electrode 12a in the photoelectric converter 12, the gate electrode 22e of the amplifying transistor 22, and the first diffusion region 67n function as a charge accumulation node in which signal charge generated by the photoelectric converter 12 is accumulated.

Now, attention is given to the n-type impurity regions formed in the semiconductor substrate 60. Of the n-type impurity regions formed in the semiconductor substrate 60, the first diffusion region 67n is arranged in the p-type impurity region 66p formed in the p-type semiconductor layer 65p, which serves as a p well. The first diffusion region 67n is formed in the vicinity of the surface of the semiconductor substrate 60, and at least a portion of the first diffusion region 67n is located at the surface of the semiconductor substrate 60. A junction capacitance formed by a p-n junction between the p-type impurity region 66p and the first diffusion region 67n serves as a capacitor in which at least part of signal charge is accumulated and constitutes a part of the charge accumulation node.

In the configuration illustrated in FIG. 4, the first diffusion region 67n includes a first region 67a and a second region 67b. The impurity concentration of the first region 67a in the first diffusion region 67n is lower than the impurity concentration of the second diffusion regions 68an, 68bn, and 68dn, and the third diffusion region 68cn. The second region 67b in the first diffusion region 67n is formed in the first region 67a and has an impurity concentration that is higher than the first region 67a. The contact hole h1 is located on the second region 67b, and the contact plug cp1 is connected to the second region 67b via the contact hole h1.

As described above, since the p-type semiconductor layer 65p is arranged adjacent to the p-type semiconductor layer 63p, the potential in the p-type semiconductor layer 65p can be controlled via the p-type semiconductor layer 63p during operation of the imaging device 100. When such a structure is employed, the first region 67a in the first diffusion region 67n and the p-type impurity region 66p, which have relatively low impurity concentrations, can be arranged around the second region 67b that is included in the first diffusion region 67n and that is a portion where the contact plug cp1, which has an electrical connection with the photoelectric converter 12, and the semiconductor substrate 60 contact each other. Increasing the impurity concentration of the second region 67b, which is a connection portion of the contact plug cp1 and the semiconductor substrate 60, to be relatively high provides an advantage of suppressing a depletion layer extending to the surroundings of the connection portion of the contact plug cp1 and the semiconductor substrate 60, that is, an advantage of suppressing or reducing depletion.

Thus, the suppression or reduction of the depletion in the surroundings of the portion where the contact plug cp1 and the semiconductor substrate 60 contact each other can suppress or reduce leakage current at the interface between the contact plug cp1 and the semiconductor substrate 60, the leakage current being caused by trap sites of the semiconductor substrate 60. Also, connecting the contact plug cp1 to the second region 67b having a relatively high impurity concentration provides an advantage of reducing the contact resistance.

The contact plug cp1 is one example of a first plug containing a semiconductor and is connected to the first diffusion region 67n. The contact plug cp1 is electrically connected to the photoelectric converter 12. The expression "electrically connected" in this case means that the potential becomes substantially equal to the potential at the pixel electrode 12a in the photoelectric converter 12. The wiring resistances are not taken into account.

Each of the contact plugs cp2, cp3, and cp4 is one example of a second plug containing a semiconductor. The contact plug cp2 is connected to the second diffusion region 68an. The contact plug cp3 is connected to the second diffusion region 68bn. The contact plug cp4 is connected to the second diffusion region 68dn. The contact plugs cp3 and cp4 are not electrically connected to the photoelectric converter 12. In the present embodiment, the contact plugs cp2, cp3, and cp4 have substantially the same configuration. A specific configuration of the contact plugs cp1 and cp3 will be described below with reference to FIG. 5.

FIG. 5 is an enlarged sectional view of the vicinity of two contact plugs in the imaging device according to the present embodiment. Specifically, FIG. 5 is an enlarged view of a range including the contact plugs cp1 and cp3 in the sectional view illustrated in FIG. 4.

As illustrated in FIG. 5, the contact plug cp1 has a contact cp1a and a pad cp1b. Each of the contact cp1a and the pad cp1b is a portion of the contact plug cp1. The contact plug cp1 is formed using electrically semiconducting material, such as polysilicon. The contact plug cp1 contains an impurity of the first conductivity type. The impurity of the first conductivity type is, for example, an n-type impurity, such as phosphorous.

The contact cp1a is one example of a first contact. The contact cp1a is connected to the first diffusion region 67n and penetrates the insulating layer 70. Specifically, the contact cp1a is provided so as to fill the contact hole h1. The plan-view shape of the contact cp1a matches the plan-view shape of the contact hole h1. Although the plan-view shape of the contact cp1a is, for example, a circular shape, as illustrated in FIG. 3, the plan-view shape may be a rectangular shape.

The pad cp1b is one example of a first pad. The contact pad cp1b is on the contact cp1a, and has a larger area than the area of the contact cp1a in plan view. As illustrated in FIG. 3, the pad cp1b completely covers the contact cp1a in plan view. The contact cp1a is located at the center of the pad cp1b. Although the plan-view shape of the pad cp1b is, for example, a rectangular shape, the plan-view shape is not limited thereto. The plan-view shape of the pad cp1b matches the plan-view shape of the contact plug cp1.

As illustrated in FIG. 5, the contact plug cp3 has a contact cp3a and a pad cp3b. Each of the contact cp3a and the pad cp3b is a portion of the contact plug cp3. The contact plug cp3 is formed using electrically semiconducting material, such as polysilicon. The contact plug cp3 contains an impurity of the first conductivity type. The impurity of the first conductivity type is, for example, an n-type impurity, such as phosphorous. In the present embodiment, the concentration of the impurity in the contact plug cp3 is equal to the concentration of the impurity in the contact plug cp1.

The contact cp3a is one example of a second contact. The contact cp3a is connected to the second diffusion region 68bn and penetrates the insulating layer 70. Specifically, the contact cp3a is provided so as to fill the contact hole h3. The plan-view shape of the contact cp3a matches the plan-view shape of the contact hole h3. Although the plan-view shape of the contact cp3a is, for example, a circular shape, as illustrated in FIG. 3, the plan-view shape may be a rectangular shape.

The pad cp3b is one example of a second pad. The pad cp3b is on the contact cp3a and has a larger area than the area of the contact cp3a in plan view. As illustrated in FIG. 3, the pad cp3b completely covers the contact cp3a in plan view. The contact cp3a is located at the center of the pad cp3b. Although the plan-view shape of the pad cp3b is, for example, a rectangular shape, the plan-view shape is not limited thereto. The plan-view shape of the pad cp3b matches the plan-view shape of the contact plug cp3.

In the present embodiment, as illustrated in FIG. 3, in plan view, the area of the contact plug cp1 is smaller than the area of each of the contact plugs cp2, cp3, and cp4. In other words, in plan view, the area of each of the contact plugs cp2, cp3, and cp4 is larger than the area of the contact plug cp1. For example, in plan view, the contact plug cp1 has the smallest of the areas of the plugs included in the pixel 10.

For example, in plan view, the area of the pad cp1b is smaller than the area of the pad cp3b. In the present embodiment, the area of the contact cp1a is equal to the area of the contact cp3a.

In the present embodiment, as illustrated in FIG. 3, a width W3 of the pad cp3b is larger than a width W1 of the pad cp1b. The width W1 is the dimension of the pad cp1b in a direction parallel to a width direction of the gate electrode 26e of the reset transistor 26. The width W3 is the dimension of the pad cp3b in a direction parallel to a width direction of the gate electrode 22e of the amplifying transistor 22. For example, the width W1 is smaller than the width of the pad of each of the other contact plugs cp2, cp3, and cp4 included in the pixel 10.

As described above, the contact plug cp1 is connected to the second region 67b in the first diffusion region 67n. The second region 67b contains an impurity that diffuses thermally from the contact plug cp1 through the contact hole h1. The impurity is, for example, an n-type impurity. The n-type impurity is, for example, phosphorous. As described above, the area of the contact plug cp1 is smaller than area of each of the contact plugs cp2, cp3, and cp4 in plan view. Accordingly, the amount of the impurity contained in the contact plug cp1 can be made smaller than the amount of the impurity contained in each of the contact plugs cp2, cp3, and cp4. Thus, the impurity concentration of the second region 67b formed below the contact plug cp1 can be made lower than the impurity concentration of the region formed below each of the contact plugs cp2, cp3, and cp4. This makes it possible to suppress or reduce junction leakage around the second region 67b.

In this example, the first region 67a having a lower impurity concentration than the second region 67b is interposed between the second region 67b and the p-type impurity region 66p, and the first region 67a is also interposed between the second region 67b and the p-type semiconductor layer 65p. Since the first region 67a having a relatively low impurity concentration is arranged around the second region 67b, it is possible to attenuate the strength of an electric field formed by a p-n junction between the first diffusion region 67n and the p-type semiconductor layer 65p or the p-type impurity region 66p. The attenuation of the strength of the electric field suppresses or reduces leakage current due to the electrical field formed by the p-n junction.

Figure 6:
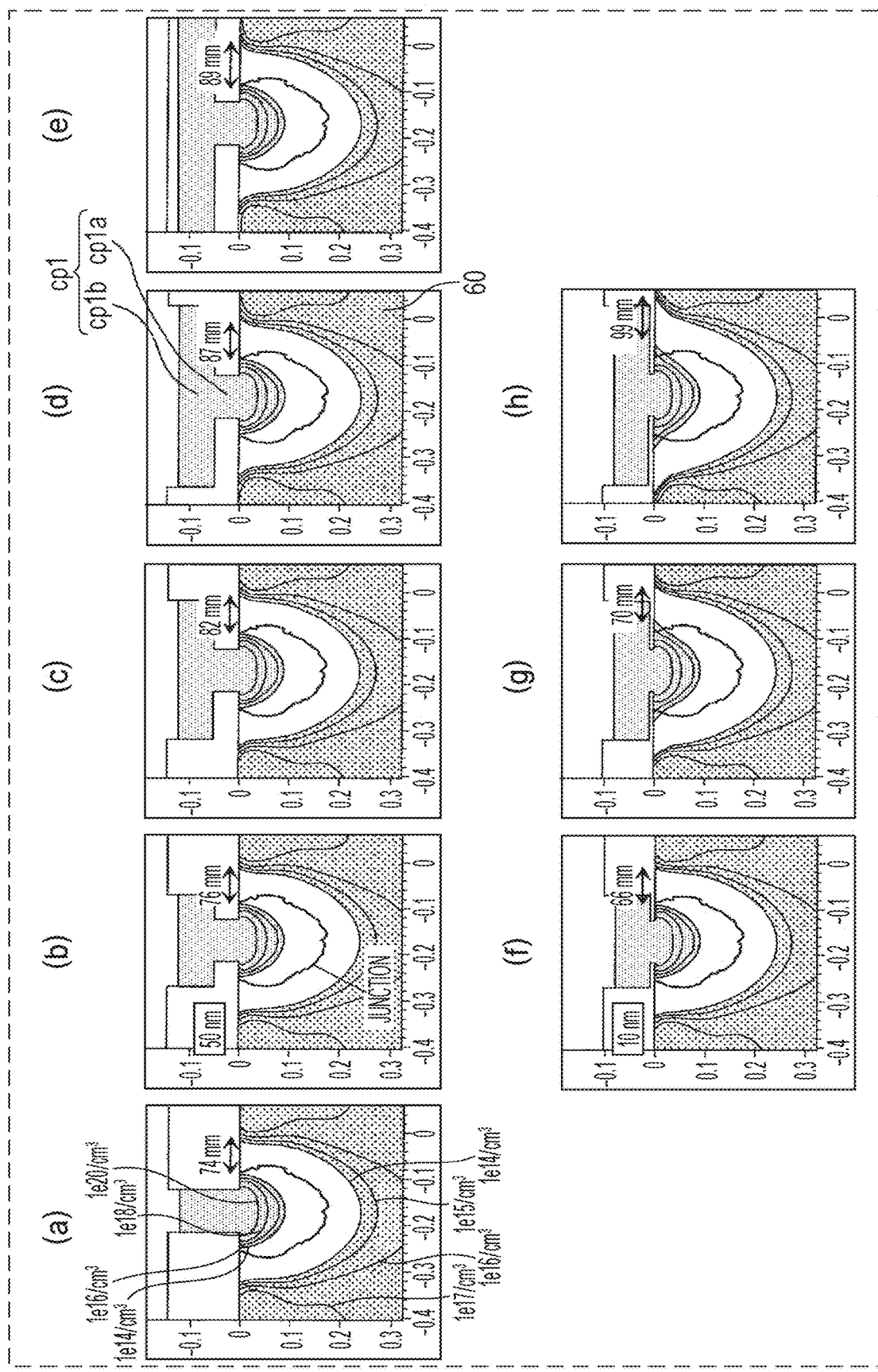
FIG. 6 is a view illustrating density profiles of electrons and holes in the vicinity of one contact plug in the imaging device according to the first embodiment with respect to respective widths of a pad.

FIG. 6 is a view illustrating density profiles of electrons and holes in the vicinity of the contact plug cp1 when the width of the pad cp1b in the imaging device 100 according to the present embodiment is varied. The density profile illustrated in part (a) in FIG. 6 represents a case in which the contact plug cp1 does not have the pad cp1b, in other words, the width of the pad cp1b is equal to the width W1 of the contact cp1a. In part (a) in FIG. 6, the width of the contact plug cp1 is 90 nm. The density profiles illustrated in parts (b), (c), and (d) in FIG. 6 represent cases in which the distance between the pad cp1b and the surface of the semiconductor substrate 60 is 50 nm, and the widths W1 of the pad cp1b are 200 nm, 300 nm, and 400 nm, respectively. The density profile illustrated in part (e) in FIG. 6 represents a case in which the width W1 of the pad cp1b is sufficiently large relative to the width of the contact cp1a, specifically, is regarded as being infinite in simulation. The density profiles in parts (f), (g), and (h) in FIG. 6 represent cases in which the distance between the pad cp1b and the surface of the semiconductor substrate 60 is 10 nm, and the widths W1 of the pad cp1b are 200 nm, 300 nm, and 400 nm, respectively. In the examples illustrated in FIG. 6, a voltage of 0.5 V is applied to each pad.

In each density profile in FIG. 6, hatching with high-density dots is applied to a region containing a large number of electrons, and hatching with low-density dots is applied to a region containing a large number of holes. Solid lines depicted in each region are contour lines of electrons or holes. The region including a large number of electrons is, specifically, a region where the density of electrons is larger than or equal to $1 \times 10^{14}/\text{cm}^3$. The region including a large number of holes is, specifically, a region where the density of holes is larger than or equal to $1 \times 10^{14}/\text{cm}^3$. It can be seen that the region including a large number of electrons extends from the contact cp1a of the contact plug cp1 into the first diffusion region 67n.

A region between the region including a large number of electrons and the region including a large number of holes corresponds to the depletion layer. The width of the depletion layer at the surface of the semiconductor substrate 60 is denoted by a bi-directional arrow, and the width of the depletion layer in each density profile is denoted by a numerical value.

It can be seen that the width of the depletion layer increases, as the width of the pad cp1b increases, that is, as the area of the pad cp1b increases, as illustrated in FIG. 6. In other words, the width of the depletion layer decreases, as the width of the pad cp1b decreases, that is, as the area of the pad cp1b decreases. The same tendency is found both when the distance between the pad cp1b and the surface of the semiconductor substrate 60 is 50 nm and the distance between the pad cp1b and the surface of the semiconductor substrate 60 is 10 nm. Accordingly, when the area of the contact plug cp1 is reduced, the area of the depletion layer at the surface of the semiconductor substrate 60 decreases.

The reason why the width of the depletion layer decreases as the area of the pad cp1b decreases is surmised as described below. Of charge generated by the photoelectric converter 12, signal charge is accumulated in the first diffusion region 67n via the contact plug cp1. When the signal charge is, for example, charge of holes, the contact plug cp1 is charged positively. That is, the potential at the contact plug cp1 increases. At this point, the pad cp1*b* applies a positive electrical field to the surface of the semiconductor substrate 60. Owing to influences of the positive electrical field, holes, which are majority carriers in the semiconductor substrate 60, are pushed toward outside of the pad cp1*b* in plan view. As a result, the area of the depletion layer at the surface of the semiconductor substrate 60 increases.

In the present embodiment, a distance D3 is larger than a distance D1, as illustrated in FIG. 3. The distance D1 is the distance between the pad cp1*b* and the gate electrode 26*e*. The distance D3 is the distance between the pad cp3*b* and the gate electrode 22*e*. For example, the distance D1 is smaller than the distance between the pad of each of the other contact plugs cp2, cp3, and cp4 included in the pixel 10 and the gate electrode that is the closest to the pad.

Reducing the distance between the contact plug cp1, connected to the first diffusion region 67*n* that functions as a charge accumulation region, and the gate electrode 26*e* of the reset transistor 26, the gate electrode 26*e* including the first diffusion region 67*n* as its drain or source, can suppress or reduce the depletion layer extending toward the gate electrode 26*e*.

As described above, a depletion layer region is formed between the first diffusion region 67*n* and the p-type impurity region 66*p*. In general, a crystal defect density in the vicinity of the surface of the semiconductor substrate 60 is higher than a crystal defect density inside the semiconductor substrate 60. Thus, in the depletion layer region formed at the p-n junction that is a portion where the first diffusion region 67*n* and the p-type impurity region 66*p* join together, a depletion layer region formed at the junction in the vicinity of the surface of the semiconductor substrate 60 has a larger amount of leakage current than a depletion layer region formed at the p-n junction inside the semiconductor substrate 60.

Also, when the area of the depletion layer region formed at the junction at the surface of the semiconductor substrate 60 (this depletion layer region is hereinafter referred to as an "interface depletion layer") increases, leakage current is likely to increase. In other words, when the area of the interface depletion layer exposed at the surface of the semiconductor substrate 60 is reduced, leakage current can be suppressed or reduced. For example, the area of the interface depletion layer may be minimized.

In the present embodiment, in plan view, the area of the contact plug cp1 connected to the first diffusion region 67*n* is smaller than the area of the contact plug cp3 connected to the second diffusion region 68*bn*, as described above. This makes it possible to reduce the area of the interface depletion layer that extends in the vicinity of the first diffusion region 67*n*, as illustrated in FIG. 6. Accordingly, it is possible to suppress or reduce leakage current from the first diffusion region 67*n* or to the first diffusion region 67*n*.

In plan view, the area of the first diffusion region 67*n* may be formed so as to be smaller than the area of the second diffusion region 68*an* in order to reduce the area of the interface depletion layer. For example, in plan view, the area of the first diffusion region 67*n* may be smaller than or equal to half of the area of the second diffusion region 68*an*. In this case, the width in a channel width direction of the first diffusion region 67*n* may be smaller than or equal to half of the width in a channel width direction of the second diffusion region 68*an*. The first diffusion region 67*n* and the second diffusion region 68*an* may be the same in either the width in the channel width direction or the length in the channel length direction. Also, in plan view, the area of the first diffusion region 67*n* may be formed so as to be smaller than the area of each of the second diffusion regions 68*bn* and 68*dn* and the third diffusion region 68*cn*.

Consider a case in which the element isolation region 69 is formed around the first diffusion region 67*n* and the p-type impurity region 66*p* after the gates and the contact plugs are formed. The element isolation region 69 is formed after the first diffusion region 67*n* and the contact plug cp1 are formed. The element isolation region 69 is formed outside the contact plug cp1 relative to the first diffusion region 67*n*. Accordingly, when the area of the contact plug cp1 is large, the spacing between the first diffusion region 67*n* and the element isolation region 69 and the spacing between the p-type impurity region 66*p* and the element isolation region 69 increase. Thus, the depletion layer region extends, and the junction leakage increases. Also, there is a possibility that an impurity having an opposite polarity of the contact plug cp1, the impurity being used for forming the element isolation region 69, is introduced into the contact plug cp1. The introduction of the impurity causes, for example, a problem that the contact resistance increases. When the area of the contact plug cp1 increases, the amount of the impurity that is introduced also increases, and thus the degree of the increase in the contact resistance is also thought to increase. On the other hand, reducing the area of the contact plug cp1 makes it possible to suppress an increase in the junction leakage and an increase in the contact resistance.

Each of the area of the first diffusion region 67*n* and the area of the second diffusion region 68*an* may be determined by excluding the area of a portion where it overlaps the gate electrode 26*e* of the reset transistor 26 in plan view. Similarly, each of the areas of the second diffusion regions 68*bn* and 68*dn* and the area of the third diffusion region 68*cn* may be determined by excluding the area of a portion where it overlaps the gate electrode 22*e* of the amplifying transistor 22 and the gate electrode 24*e* of the address transistor 24 in plan view. The portions where the first diffusion region 67*n*, the second diffusion regions 68*an*, 68*bn*, and 68*dn*, and the third diffusion region 68*cn* overlap the gate electrodes 26*e*, 22*e*, and 24*e* in plan view are less susceptible to damage during manufacture than the portion where they do not overlap the gate electrodes 26*e*, 22*e*, and 24*e*. Examples of the damage incurred during manufacture include damage due to plasma processing used in a dry-etching process and damage due to ashing processing during resist stripping. Thus, at the portions where the first diffusion region 67*n*, the second diffusion regions 68*an*, 68*bn*, and 68*dn*, and the third diffusion region 68*cn* overlap the gate electrodes 26*e*, 22*e*, and 24*e*, leakage current is less likely to be generated. Accordingly, with respect to the first diffusion region 67*n*, the second diffusion regions 68*bn* and 68*dn*, and the third diffusion region 68*cn*, only influences of the areas of the portions where they do not overlap the gate electrodes 26*e*, 22*e*, and 24*e* may be considered in terms of reducing the area of the interface depletion layer.

Also, when the area of the first diffusion region 67*n* is reduced, the distance between the contact hole h1 formed in the first diffusion region 67*n* and the gate electrode 26*e* becomes smaller than, for example, the distance between the contact hole h2 formed in the second diffusion region 68*an* and the gate electrode 26*e*. That is, as illustrated in FIG. 3, the distance D1 between the pad cp1*b* of the contact plug cp1 and the gate electrode 26*e* becomes smaller than the distance between the pad of the contact plug cp2 and the gate electrode 26*e*. Since the impurity concentration of the first diffusion region 67*n* is low, as described above, the resistance value of the first diffusion region 67*n* is higher than the resistance value of the second diffusion region 68*an*. Accordingly, when the distance between the contact hole h1 and the gate electrode 26*e* is reduced, a current path in the first diffusion region 67*n* decreases, and thus the resistance value in the first diffusion region 67*n* decreases.

Also, the distance between the contact hole h1 formed in the first diffusion region 67*n* and the gate electrode 26*e* may be smaller than the distance between the contact hole h3 formed in the second diffusion region 68*bn* and the gate electrode 22*e* and may be smaller than the distance between the contact hole h4 formed in the second diffusion region 68*dn* and the gate electrode 24*e*. That is, the distance D1 may be smaller than the distance D3 between the pad cp3*b* of the contact plug cp3 and the gate electrode 22*e*. Alternatively, the distance D1 may be smaller than the distance between the pad of the contact plug cp4 and the gate electrode 24*e*.

First Modification

Next, a description will be given of a first modification of the present embodiment. Differences from the first embodiment will be mainly described below, and descriptions of the same or similar points will not be given or will be briefly given.

Figure 7:
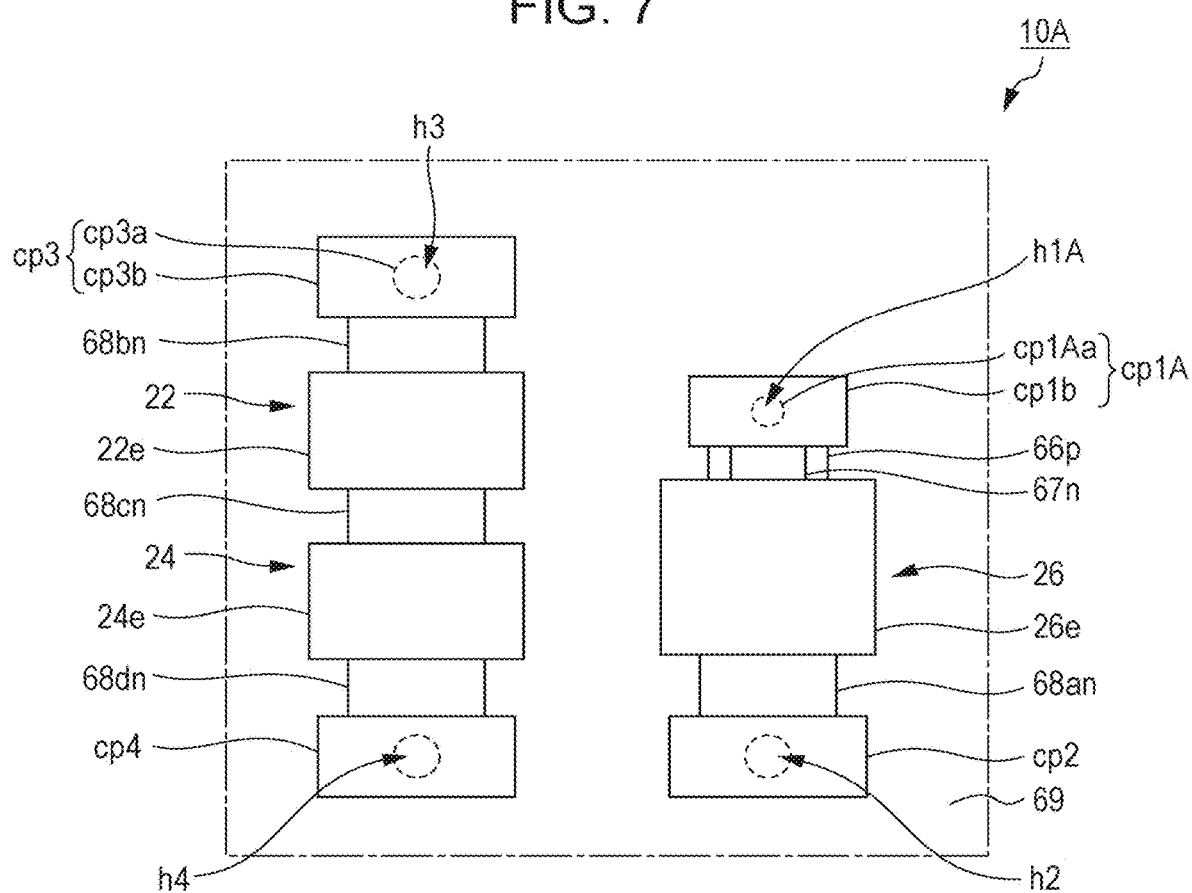
FIG. 7 is a plan view illustrating a layout in one pixel in an imaging device according to a first modification of the first embodiment.

FIG. 7 is a plan view illustrating a layout in a pixel 10A in an imaging device according to the first modification. Compared with the pixel 10 according to the first embodiment, the pixel 10A differs in the area of a contact cp1Aa.

Specifically, as illustrated in FIG. 7, compared with the pixel 10 according to the first embodiment, the pixel 10A includes a contact plug cp1A instead of the contact plug cp1. The contact plug cp1A has the contact cp1Aa and a pad cp1*b*.

In plan view, the area of the contact cp1Aa is smaller than the area of the contact cp3*a*. For example, the area of the contact cp1Aa may be smaller than or equal to half of the area of the contact cp3. Also, the area of the contact cp1Aa may be smaller than the area of the contact of each of the contact plugs cp2 and cp4. That is, the area of the contact cp1Aa may be the smallest area of the contacts of all contact plugs included in the pixel 10A.

When the size of the contact cp1Aa is made smaller than the size of each of the contacts of the other contact plugs cp2, cp3, and cp4, it is possible to reduce the concentration of the impurity that diffuses thermally to the first diffusion region 67*n* via the contact cp1Aa. This reduces extension of a region where the impurity contained in the contact plug cp1A diffuses in the first diffusion region 67*n* immediately below the contact plug cp1A. Specifically, a high concentration region of the n-type impurity becomes less likely to extend in the first diffusion region 67*n*. Accordingly, for example, even when a p-type element isolation region 69 is brought close to the first diffusion region 67*n*, an electric field strength at the interface between the high concentration region of the n-type impurity in the first diffusion region 67*n* and the p-type element isolation region 69 can be suppressed or reduced to a certain strength or lower. Therefore, while suppressing or reducing the electric field strength at the interface between the high concentration region of the n-type impurity in the first diffusion region 67*n* and the p-type element isolation region 69 to a certain strength or more, it is possible to reduce the distance between the high concentration region of the n-type impurity and the p-type element isolation region 69 to a certain distance or smaller.

This can suppress extension of the interface depletion layer, thus making it possible to suppress an increase in the leakage current.

Second Modification

Next, a description will be given of a second modification of the present embodiment. Differences from the first embodiment will be mainly described below, and descriptions of the same or similar points will not be given or will be briefly given.

Figure 8:
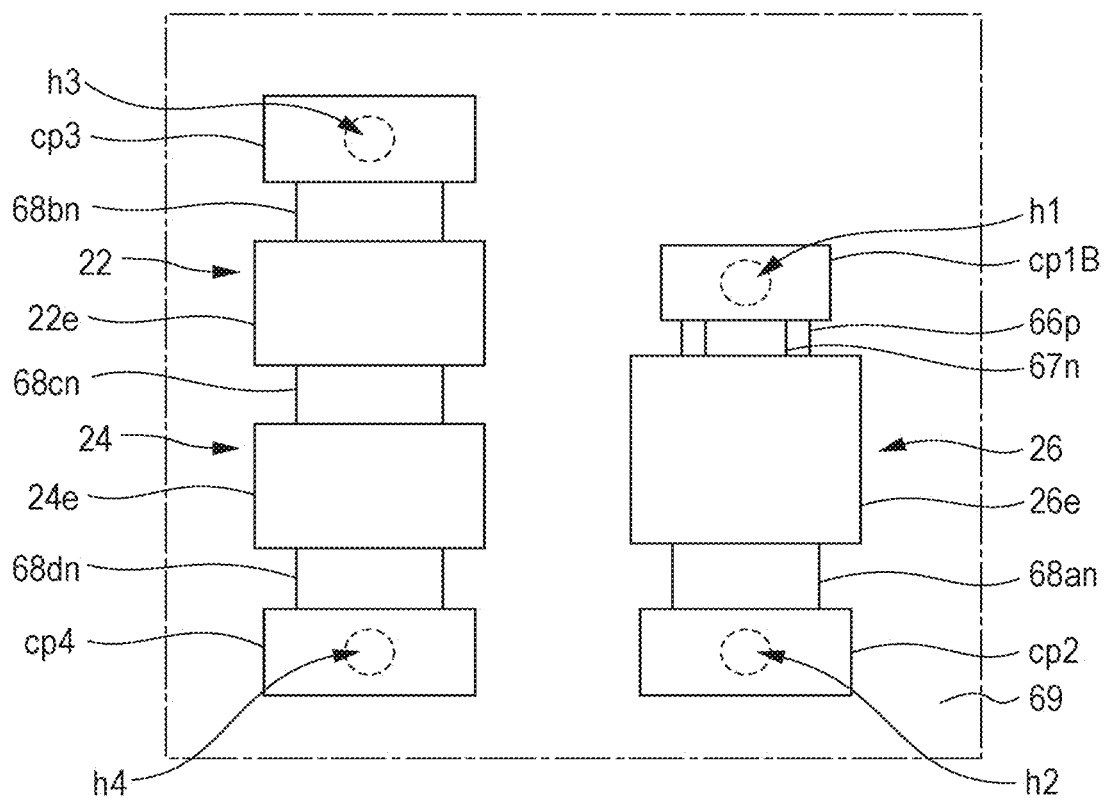
FIG. 8 is a plan view illustrating a layout in one pixel in an imaging device according to a second modification of the first embodiment.

FIG. 8 is a plan view illustrating a layout in a pixel 10B in an imaging device according to the second modification. Compared with the pixel 10 according to the first embodiment, the pixel 10B differs in the concentration of an impurity in the contact plug cp1.

Specifically, as illustrated in FIG. 8, compared with the pixel 10 according to the first embodiment, the pixel 10B includes a contact plug cp1B instead of the contact plug cp1. The concentration of an impurity contained in the contact plug cp1B is lower than the concentration of an impurity contained in the contact plug cp3. Also, for example, the concentration of the impurity contained in the contact plug cp1B may be lower than the concentration of the impurity contained in each of the contact plugs cp2 and cp4. That is, the concentration of the impurity in the contact plug cp1B may be the lowest of the concentrations of impurities in all contact plugs included in the pixel 10B.

When the concentration of an impurity in the contact plug cp1 is made lower than the concentrations of impurities in the contact plugs cp2, cp3, and cp4, it is possible to reduce the concentration of an impurity that diffuses thermally from the contact plug cp1 to the first diffusion region 67*n*. Thus, for the same reason as that in the first modification, an increase in the leakage current can be suppressed.

Second Embodiment

Next, a description will be given of a second embodiment. Differences from the first embodiment will be mainly described below, and descriptions of the same or similar points will not be given or will be briefly given.

Figure 9:
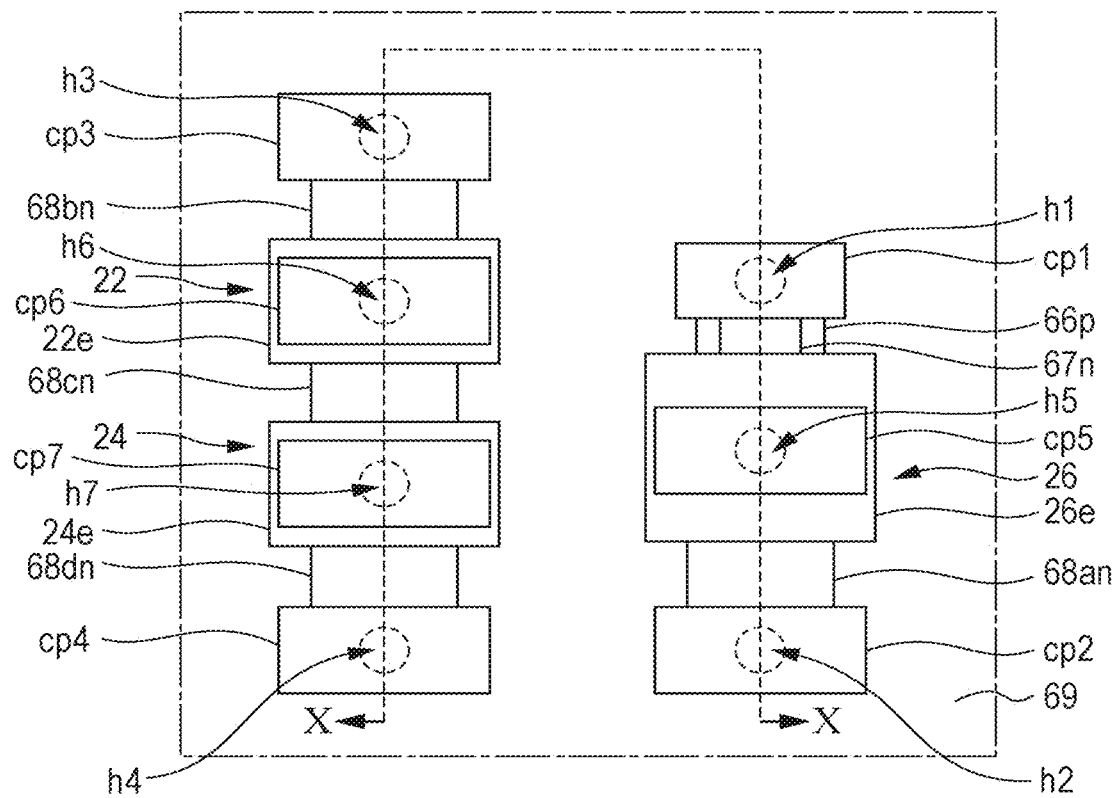
FIG. 9 is a plan view illustrating a layout in one pixel in an imaging device according to a second embodiment.
Figure 10:
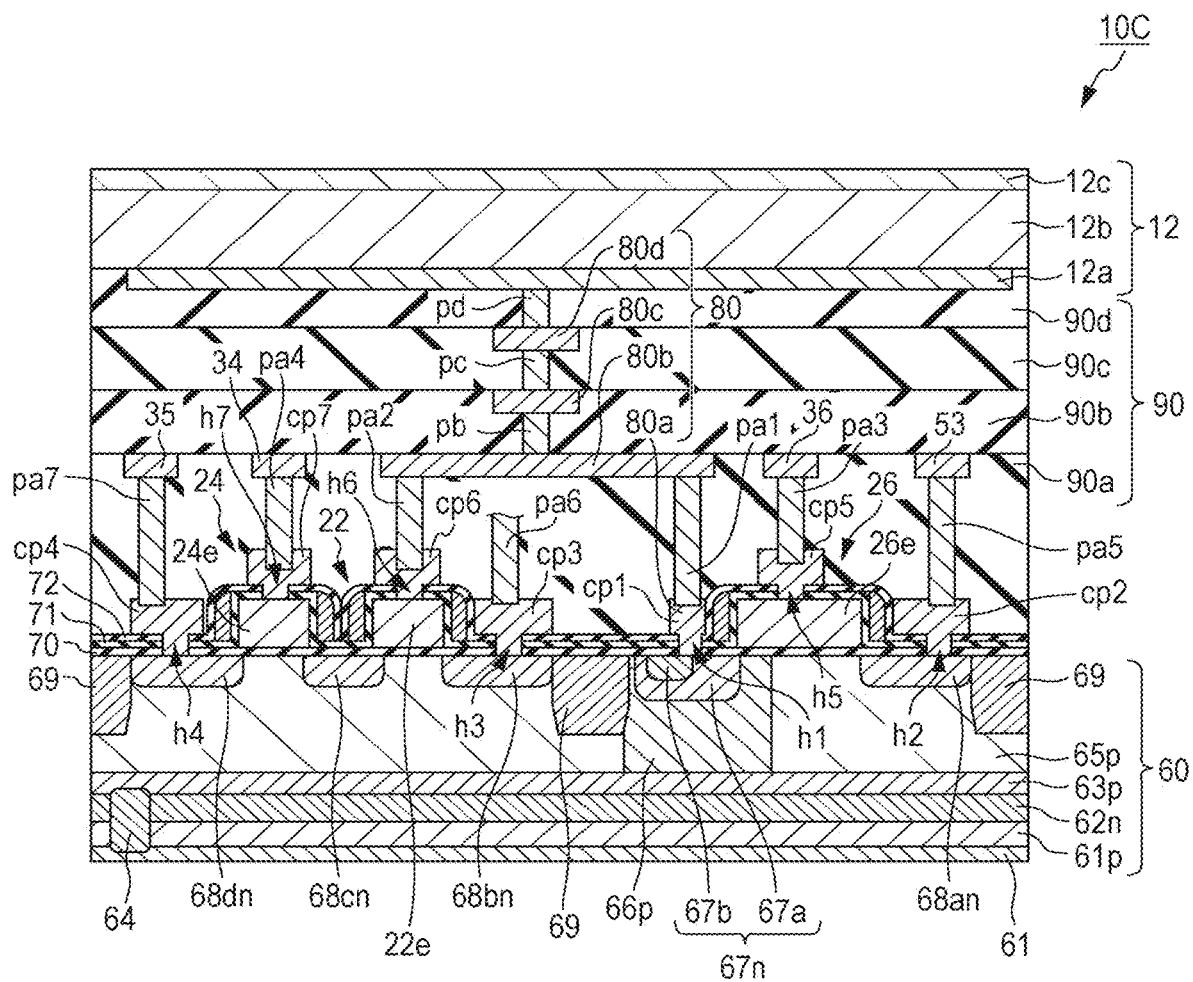
FIG. 10 is a schematic sectional view illustrating a device structure of one pixel in an imaging device according to the second embodiment.

FIG. 9 is a plan view illustrating a layout in a pixel 10C in an imaging device according to the second embodiment. FIG. 10 is a schematic sectional view illustrating a device structure of the pixel 10C in the imaging device according to the second embodiment. FIG. 10 is a sectional view when the pixel 10C is cut along line X-X in FIG. 9 and is extended in arrow directions. A major difference between the pixel 10C illustrated in FIG. 10 and the pixel 10 illustrated in FIG. 4 is that gate electrodes and contact plugs are formed in different wiring layers.

Specifically, compared with the pixel 10 according to the first embodiment, the pixel 10C differs in that it further includes contact plugs cp5, cp6, and cp7 and an insulating layer 72, as illustrated in FIGS. 9 and 10.

The insulating layer 72 is provided on the insulating layer 71. In the present embodiment, each of the contact holes h1 to h7 is a through hole that penetrates not only the insulating layer 71 but also the insulating layer 72. The contact plugs cp5, cp6, and cp7 are arranged at the positions of the contact holes h5, h6, and h7, respectively. The insulating layer 72 is, for example, a silicon oxide film. The insulating layer 72 may have a laminated structure including a plurality of insulating layers.

The contact plug cp5 provides connection between the plug pa3 and the gate electrode 26*e*. As illustrated in FIG. 9, the contact plug cp5 is provided at a position where it overlaps the gate electrode 26e in plan view.

The contact plug cp6 provides connection between the plug pa2 and the gate electrode 22e. As illustrated in FIG. 9, the contact plug cp6 is provided at a position where it overlaps the gate electrode 22e in plan view.

The contact plug cp7 provides connection between the plug pa4 and the gate electrode 24e. As illustrated in FIG. 9, the contact plug cp7 is provided at a position where it overlaps the gate electrode 24e in plan view.

For example, in the first embodiment, the contact plugs cp1 to cp4 and the gate electrodes 22e, 24e, and 26e are formed in the same wiring layer by using material containing the same impurity. In contrast, in the second embodiment, the contact plugs cp1 to cp7 and the gate electrodes 22e, 24e, and 26e are formed in different wiring layers.

Material in the contact plugs cp1 to cp7 and material in the gate electrodes 22e, 24e, and 26e may be the same or may be different from each other. Also, for example, when the contact plugs cp1 to cp7 and the gate electrodes 22e, 24e, and 26e are formed of polysilicon material, the concentrations of impurities in the polysilicon may be different from each other.

In the present embodiment, making the area of the contact plug cp1 smaller than the area of each of the contact plugs cp2, cp3, and cp4 in plan view can reduce influences of an electrical field which are caused by the contact plug cp1 and can reduce the area of the interface depletion layer in the semiconductor substrate 60, as in the first embodiment. This makes it possible to reduce leakage current from the first diffusion region 67n or to the first diffusion region 67n.

OTHER EMBODIMENTS

Although the imaging device according to the present disclosure has been described above based on some embodiments and modifications, the present disclosure is not limited to these embodiments and modifications. A mode obtained by making various variations conceived by those skilled in the art to the embodiments and the modifications and another mode constructed by a combination of some of the constituent elements in the embodiments and the modifications are also encompassed in the scope of the present disclosure, as long as such modes do not depart from the spirit of the present disclosure.

For example, the photoelectric converter 12 may be a photodiode formed in the semiconductor substrate 60. That is, the imaging device 100 does not necessarily have to be a lamination type imaging device.

In addition, for example, the width W1 of the pad cp1b of the contact plug cp1 connected to the first diffusion region 67n and the width W3 of the pad cp3b of the contact plug cp3 connected to the second diffusion region 68bn may be equal to each other. In this case, a length L1 (see FIG. 3) of the pad cp1b may be smaller than a length L3 of the pad cp3b. Herein, the length L1 is the dimension of the pad cp1b in a direction parallel to a length direction of the gate electrode 26e. The length L3 is the dimension of the pad cp3b in a direction parallel to a length direction of the gate electrode 22e. Thus, the area of the pad cp1b may be smaller than the area of the pad cp3b. Both the width W1 and the length L1 of the pad cp1b may be smaller than the width W3 and the length L3, respectively, of the pad cp3b. The pad cp1b and the pads of the contact plugs cp2 and cp4 may also have a similar relationship.

For example, the pixels included in the imaging device 100 may have configurations that differ from each other. For example, the imaging device 100 may have at least two of the pixels 10, 10A, 10B, and 10C.

In addition, according to the embodiments and modifications of the present disclosure, since influences due to leakage current can be reduced, it is possible to provide an imaging device that can capture images with high image quality. Each of the amplifying transistor 22, the address transistor 24, and the reset transistor 26 may be an N-channel MOSFET or a P-channel MOSFET. When each of these transistors is a P-channel MOSFET, the impurity of the first conductivity type is a p-type impurity, and the impurity of the second conductivity type is an n-type impurity. All of the transistors do not have to be unified to either N-channel MOSFETs or P-channel MOSFETs. When the transistors in the pixels are implemented by N-channel MOSFETs, and electrons are used as signal charge, the arrangement of the source and the drain of each of the transistors may be interchanged.

Also, in each embodiment described above, various changes, replacements, additions, and omissions can be made in the claims or in an equivalent scope thereof.

What is claimed is:

1. An imaging device comprising:
a photoelectric converter that converts light into a charge;
a first diffusion region of a first conductivity type to which the charge is input;
a second diffusion region of the first conductivity type;
a first plug that has a first surface directly connected to the first diffusion region; and
a second plug that has a second surface directly connected to the second diffusion region, wherein
an area of the second surface of the second plug is larger than an area of the first surface of the first plug in a plan view.

2. The imaging device according to claim 1, further comprising:
a first transistor that includes the first diffusion region as one of a source and a drain and that includes a first gate; and
a second transistor that includes the second diffusion region as one of a source and a drain and that includes a second gate.

3. The imaging device according to claim 2, wherein a distance between the second surface of the second plug and the second gate in the plan view is larger than a distance between the first surface of the first plug and the first gate in the plan view.

4. The imaging device according to claim 1, wherein:
the first plug contains a first impurity of the first conductivity type,
the second plug contains a second impurity of the first conductivity type, and
a concentration of the second impurity in the second plug is higher than a concentration of the first impurity in the first plug.

5. The imaging device according to claim 1, further comprising pixels, wherein each of the pixels includes the photoelectric converter, the first and second diffusion regions and the first and second plugs.

6. An imaging device comprising:
a photoelectric converter that converts light into a charge;
a first diffusion region of a first conductivity type to which the charge is input,
a second diffusion region of the first conductivity type;
a first plug that contains a first impurity of the first conductivity type and that is directly connected to the first diffusion region; and a second plug that contains a second impurity of the first conductivity type and that is directly connected to the second diffusion region, wherein a concentration of the second impurity in the second plug is higher than a concentration of the first impurity in the first plug.

7. The imaging device according to claim 6, further comprising:

a first metal plug that is directly connected to a third surface of the first plug opposite to the first surface; and a second metal plug that is directly connected to a fourth surface of the second plug opposite to the second surface.

8. The imaging device according to claim 6, further comprising:

a first transistor that includes the first diffusion region as one of a source and a drain and that includes a first gate; and a second transistor that includes the second diffusion region as one of a source and a drain and that includes a second gate.

9. The imaging device according to claim 8, wherein the first plug has a first surface directly connected to the first diffusion region, the second plug has a second surface directly connected to the second diffusion region, and a distance between the second surface of the second plug and the second gate in a plan view is larger than a distance between the first surface of the first plug and the first gate in the plan view.

10. The imaging device according to claim 6, further comprising pixels, wherein each of the pixels includes the photoelectric converter, the first and second diffusion regions and the first and second plugs.

11. An imaging device comprising:

a photoelectric converter that converts light into a charge;

a first diffusion region of a first conductivity type to which the charge is input, a second diffusion region of the first conductivity type;

a first plug that has a first surface directly connected to the first diffusion region;

a second plug that has a second surface directly connected to the second diffusion region;

a first transistor that includes the first diffusion region as one of a source and a drain and that includes a first gate; and a second transistor that includes the second diffusion region as one of a source and a drain and that includes a second gate, wherein a distance between the second surface of the second plug and the second gate in a plan view is larger than a distance between the first surface of the first plug and the first gate in the plan view.

12. The imaging device according to claim 11, wherein the first plug contains a first impurity of the first conductivity type and the second plug contains a second impurity of the first conductivity type.

13. The imaging device according to claim 11, further comprising:

a first metal plug that is directly connected to a third surface of the first plug opposite to the first surface; and a second metal plug that is directly connected to a fourth surface of the second plug opposite to the second surface.

14. The imaging device according to claim 11, further comprising pixels, wherein each of the pixels includes the photoelectric converter, the first and second diffusion regions and the first and second plugs.

15. The imaging device according to claim 1, further comprising a semiconductor substrate including the first and second diffusion regions.

16. The imaging device according to claim 6, further comprising a semiconductor substrate including the first and second diffusion regions.

17. The imaging device according to claim 11, further comprising a semiconductor substrate including the first and second diffusion regions.

* * * * *